United States Patent
Son et al.

(10) Patent No.: US 8,848,475 B2
(45) Date of Patent: Sep. 30, 2014

(54) FUSE CIRCUIT, FUSE ARRAY, SEMICONDUCTOR MEMORY DEVICE AND METHOD OF MANUFACTURING SEMICONDUCTOR DEVICE

(75) Inventors: Jong-Pil Son, Yongin-si (KR);
Seong-Jin Jang, Seongnam-si (KR);
Byung-Sik Moon, Seoul (KR);
Hyuck-Chai Jung, Hwaseong-si (KR);
Ju-Seop Park, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 512 days.

(21) Appl. No.: 13/219,749

(22) Filed: Aug. 29, 2011

(65) Prior Publication Data
US 2012/0051154 A1    Mar. 1, 2012

(30) Foreign Application Priority Data
Aug. 27, 2010    (KR) .......................... 10-2010-0083211

(51) Int. Cl.
| | |
|---|---|
| *G11C 17/18* | (2006.01) |
| *G11C 17/16* | (2006.01) |
| *H01L 27/10* | (2006.01) |
| *H01L 23/525* | (2006.01) |

(52) U.S. Cl.
CPC .............. *H01L 27/101* (2013.01); *G11C 17/16* (2013.01); *G11C 17/18* (2013.01); *H01L 23/5252* (2013.01)
USPC ..................... 365/225.7; 365/189.16; 365/63

(58) Field of Classification Search
CPC ....... G11C 17/16; G11C 17/18; G11C 29/027
USPC ................................. 365/225.7, 189.16, 63
See application file for complete search history.

(56) References Cited

U.S. PATENT DOCUMENTS

| | | | |
|---|---|---|---|
| 7,940,595 B2* | 5/2011 | Kurjanowicz | 365/226 |
| 2010/0011266 A1* | 1/2010 | Kurjanowicz | 714/735 |
| 2011/0317804 A1* | 12/2011 | Kurjanowicz | 377/78 |
| 2014/0078842 A1* | 3/2014 | Oh et al. | 365/200 |

FOREIGN PATENT DOCUMENTS

| | | |
|---|---|---|
| JP | 2007-116045 | 5/2007 |
| JP | 2009-277294 | 11/2009 |
| KR | 10-0940198 | 2/2010 |

* cited by examiner

*Primary Examiner* — Tuan T Nguyen
(74) *Attorney, Agent, or Firm* — Stanzione & Kim, LLP

(57) ABSTRACT

A fuse circuit includes a program unit and a sensing unit. The program unit is programmed in response to a program signal and outputs a program output signal in response to a sensing enable signal. The sensing unit outputs a sensing output signal based on the program output signal and the sensing output signal indicates whether the program unit is programmed or not. The program unit includes an anti-fuse cell, a selection transistor, a program transistor and a sensing transistor. The anti-fuse cell includes at least two anti-fuse elements which are connected in parallel and are respectively broken down at different levels of a program voltage.

16 Claims, 16 Drawing Sheets

410

420

430

440

FUSE CIRCUIT, FUSE ARRAY, SEMICONDUCTOR MEMORY DEVICE AND METHOD OF MANUFACTURING SEMICONDUCTOR DEVICE

CROSS-REFERENCE TO RELATED APPLICATIONS

This US non-provisional application claims benefit of priority under 35 USC §119 to Korean Patent Application No. 10-2010-0083211 filed on Aug. 27, 2010 in the Korean Intellectual Property Office (KIPO), the contents of which are herein incorporated by reference in their entirety.

BACKGROUND OF THE INVENTION

1. Field of the Invention

Example embodiments relate to electrical fusing, and more particularly a fuse circuit, a fuse array, a semiconductor memory device, and a method of manufacturing semiconductor device.

2. Description of the Related Art

A fuse circuit is capable of providing an output signal having different logic levels according to states of programmed fuses, and the fuse circuit may be employed in various devices. For example, semiconductor memory devices include redundant memory cells to protect against problems that may arise when defective memory cells are found in the semiconductor memory devices. The defective memory cells are replaced with the redundant memory cells based on fuse information. When an address of the defective memory cell is inputted, a normal path is cut off and a redundancy path to the redundant cell is activated according to programmed/unprogrammed state of the fuse. The fuse circuit may be used for this type of repair operation.

The fuse circuit may include laser fuse, electrical fuse, or anti-fuse.

SUMMARY OF THE INVENTION

The general inventive concept is provided to substantially obviate one or more problems due to limitations and disadvantages of the related art.

Example embodiments provide a fuse circuit, fuse array including the fuse circuit, and a semiconductor memory device including the fuse array capable of enhancing program performance.

Some example embodiments provide a method of manufacturing a semiconductor device including the fuse circuit.

Additional aspects and advantages of the present general inventive concept will be set forth in part in the description which follows and, in part, will be obvious from the description, or may be learned by practice of the general inventive concept.

Features of the present general inventive concept may be achieved with a fuse circuit that includes a program unit and a sensing unit. The program unit is programmed in response to a program signal and outputs a program output signal in response to a sensing enable signal. The sensing unit outputs a sensing output signal based on the program output signal and the sensing output signal indicates whether the program unit is programmed or not, The program unit includes an anti-fuse cell, a selection transistor, a program transistor and a sensing transistor. The anti-fuse cell includes at least two anti-fuse elements which are connected in parallel and are respectively broken down at different levels of a program voltage. The anti-fuse cell includes a first end and a second end, and the first end receives the program voltage. The selection transistor, connected between the second end and a connection node, has a gate which receives a selection signal. The program transistor, connected between the connection node and a ground voltage, has a gate which receives the program signal. The sensing transistor has a first terminal connected to the connection node, a gate receiving the sensing enable signal and a second terminal providing the program output signal.

In some embodiments, the anti-fuse cell may include first and second transistors which are connected in parallel between the first and second ends.

The first transistor may be a depletion type transistor which has a gate connected to the first end and source and drain commonly connected to the second end. The second transistor may be an enhancement type transistor which has a gate connected to the first end and source and drain commonly connected to the second end.

The first transistor may be a depletion type transistor which has a gate connected to the second end and source and drain commonly connected to the first end. The second transistor may be an enhancement type transistor which has a gate connected to the second end and source and drain commonly connected to the first end.

The first transistor may be a first enhancement type transistor which has a gate connected to the first end and source and drain commonly connected to the second end. The second transistor may be a second enhancement type transistor which has a gate connected to the second end and source and drain commonly connected to the first end.

The first transistor may be a first depletion type transistor which has a gate connected to the first end and source and drain commonly connected to the second end. The second transistor may be a second depletion type transistor which has a gate connected to the second end and source and drain commonly connected to the first end.

In some embodiments, the anti-fuse cell may include first through transistors which are connected in parallel between the first and second ends.

The first transistor may be a first depletion type transistor which has a gate connected to the first end and source and drain commonly connected to the second end, the second transistor may be a first enhancement type transistor which has a gate connected to the first end and source and drain commonly connected to the second end, the third transistor may be a second depletion type transistor which has a gate connected to the second end and source and drain commonly connected to the first end and the fourth transistor may be a second enhancement type transistor which has a gate connected to the second end and source and drain commonly connected to the first end.

In some embodiments, the sensing unit may include at least one comparator which compares the program output signal with at least one reference voltage to provide the sensing output signal.

Whether the anti-fuse cell is normally programmed or not may be determined based on a logic level of the sensing output signal.

The sensing unit may include a first comparator which compares the program output signal with a first reference voltage to provide a first sensing output signal corresponding to a first bit of the sensing output signal and a second comparator which compares the program output signal with a second reference voltage to provide a second sensing output signal corresponding to a second bit of the sensing output signal.

Whether at least one of the at least two anti-fuse elements is normally programmed or not may be determined based on each logic level of each bit of the sensing output signal.

The sensing unit may include a first comparator which compares the program output signal with a first reference voltage to provide a first sensing output signal corresponding to a first bit of the sensing output signal, a second comparator which compares the program output signal with a second reference voltage to provide a second sensing output signal corresponding to a second bit of the sensing output signal and a third comparator which compares the program output signal with a third reference voltage to provide a third sensing output signal corresponding to a third bit of the sensing output signal.

Whether at least one of the at least two anti-fuse elements is normally programmed or not may be determined based on each logic level of each bit of the sensing output signal.

Features of the present general inventive concept may also be achieved by a fuse array that includes a fuse array unit and a sensing unit. The fuse array unit includes a plurality of program units, and each of the program units is programmed in response to a program signal and outputs a program output signal in response to a sensing enable signal. The sensing unit outputs a sensing output signal based on a program output signal provided from a selected one of the program units, and the sensing output signal indicates whether the selected program unit is programmed or not. Each of the program units includes an anti-fuse cell, a selection transistor, a program transistor and a sensing transistor. The anti-fuse cell includes at least two anti-fuse elements which are connected in parallel and are respectively broken down at different levels of a program voltage. The anti-fuse cell includes a first end and a second end, and the first end receives the program voltage. The selection transistor, connected between the second end and a connection node, has a gate which receives a selection signal. The program transistor, connected between the connection node and a ground voltage, has a gate which receives the program signal. The sensing transistor has a first terminal connected to the connection node, a gate receiving the sensing enable signal and a second terminal providing the program output signal.

In some embodiments, the fuse array may further include a control unit that provides the program signal and the sensing enable signal to the fuse array unit, and selectively reprograms the selected program unit based on the sensing output signal.

Features of the present general inventive concept may also be achieved with a semiconductor memory device that includes a memory cell array, an address decoder, and a repair circuit. The memory cell array includes a plurality of normal memory cells and a plurality of redundant memory cells. The address decoder selectively accesses the normal memory cells and the redundant memory cells based on an address signal and a sensing output signal. The repair circuit is programmed and outputs the sensing output signal when the normal memory cells include at least one defective cell. The repair circuit includes a fuse array, and the fuse array include includes a fuse array unit and a sensing unit. The fuse array unit includes a plurality of program units, and each of the program units is programmed in response to a program signal and outputs a program output signal in response to a sensing enable signal. The sensing unit outputs a sensing output signal based on a program output signal provided from a selected one of the program units, and the sensing output signal indicates whether the selected program unit is programmed or not.

Features of the present general inventive concept may also be achieved with a method of manufacturing a semiconductor device. In the method, a first impurity region is selectively formed in a first region of a substrate. First and second gate structures are respectively formed on the first region and a second region of the substrate. Second impurity regions are formed in the first region such that the second impurity regions are partially overlapped with the first impurity region. Third impurity region is formed in the second region.

In some embodiments, the second impurity regions and the third impurity regions may be sequentially formed.

In some embodiments, the second impurity regions and the third impurity regions may be simultaneously formed.

In some embodiments, the first impurity region may be formed using n-type impurity source gas.

In some embodiments, the first impurity region may be formed doping the first region with n-type impurity source gas after covering regions except the first region with a photomask.

In some embodiments, the second impurity regions and the third impurity regions may be formed using n-type impurity source gas.

In some embodiments, the first region may correspond to a depletion type transistor region and the second region may correspond to an enhancement type transistor region.

In some example embodiments, a semiconductor device includes a channel region formed in a first region of a substrate, first and second gate structures respectively formed in the first region and a second region of the substrate and first and second source/drain regions formed in the substrate, and the first and second source/drain regions are respectively adjacent to the first and second gate structures.

In some embodiments, each of the first and second gate structures may include a gate insulating layer, a gate conducting layer and a gate mask which are sequentially formed on the substrate.

The gate insulation layer may have a thickness equal to or smaller than 25Å.

In some embodiments, a first width and a first length of the channel which is previously formed between the first source/drain regions may be substantially the same as a second width and a second length of the channel which is formed between the second source/drain regions.

In some embodiments, the first region may correspond to a depletion type transistor region and the second region may correspond to an enhancement type transistor region.

Features of the present general inventive concept may also be realized by a semiconductor program unit including an anti-fuse cell including first and second anti-fuse units having different programming threshold voltages and connected between an input node to supply a program voltage and an output node, a program switch unit connected to the output node to program the anti-fuse cell, and a sensing switch unit connected to the output node to sense a programmed state of the anti-fuse cell. The first and second anti-fuse units are MOS transistors.

The first anti-fuse unit may be a depletion-type transistor and the second anti-fuse unit may be an enhancement-type transistor.

The depletion-type transistor may have a gate connected to the input node and source and drain commonly connected to the output node, and the enhancement-type transistor may have a gate connected to the input node and source and drain commonly connected to the output node.

The depletion-type transistor may have a gate connected to the output node and source and drain commonly connected to the input node, and the enhancement-type transistor may have a gate connected to the output node and source and drain commonly connected to the input node.

The first and second anti-fuse units may be each enhancement-type transistors, the first anti-fuse unit may have a gate connected to the input node and source and drain commonly connected to the output node, and the second anti-fuse unit may have a gate connected to the output node and source and drain commonly connected to the input node.

The first and second anti-fuse units may be each depletion-type transistors, the first anti-fuse unit may have a gate connected to the input node and source and drain commonly connected to the output node, and the second anti-fuse unit may have a gate connected to the output node and source and drain commonly connected to the input node.

The semiconductor program unit may include a selection switch unit to select one of the program switch unit and the sensing switch unit.

The program switch unit, the sensing switch unit, and the selection switch unit may be all transistors.

The semiconductor program unit may include third and fourth anti-fuse units having programming threshold voltages different from the first and second anti-fuse unit.

Accordingly, the program performance may be enhanced because the anti-fuse cell includes at least one of the anti-fuse elements which are broken down at different levels of the program voltage.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
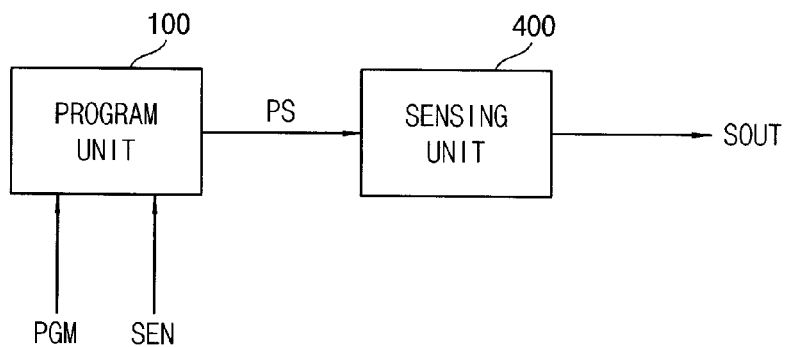
FIG. 1 is a block diagram illustrating a fuse circuit according to some example embodiments.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity. Like numerals refer to like elements throughout.

It will be understood that, although the terms "first," "second," "third" etc. may be used herein to describe various elements, these elements should not be limited by these terms. These terms are used to distinguish one element from another. Thus, a first element discussed below could be termed a second element without departing from the teachings of the present inventive concept. For example, these terms may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept As used herein, the singular forms "a," "an" and the are intended to include the plural forms as well, unless the context clearly Indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a fuse circuit according to some example embodiments.

Referring to FIG. 1, a fuse circuit 10 includes a program unit 100 and a sensing unit 400.

Figure 2A:
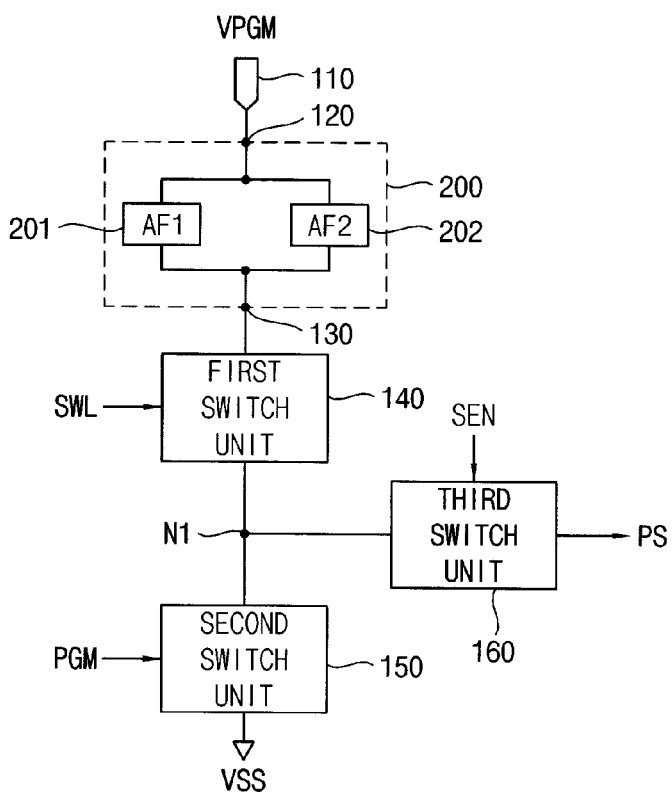
FIGS. 2A and 2B are circuit diagrams illustrating an example of the program unit in FIG. 1 according to example embodiments.
Figure 2B:
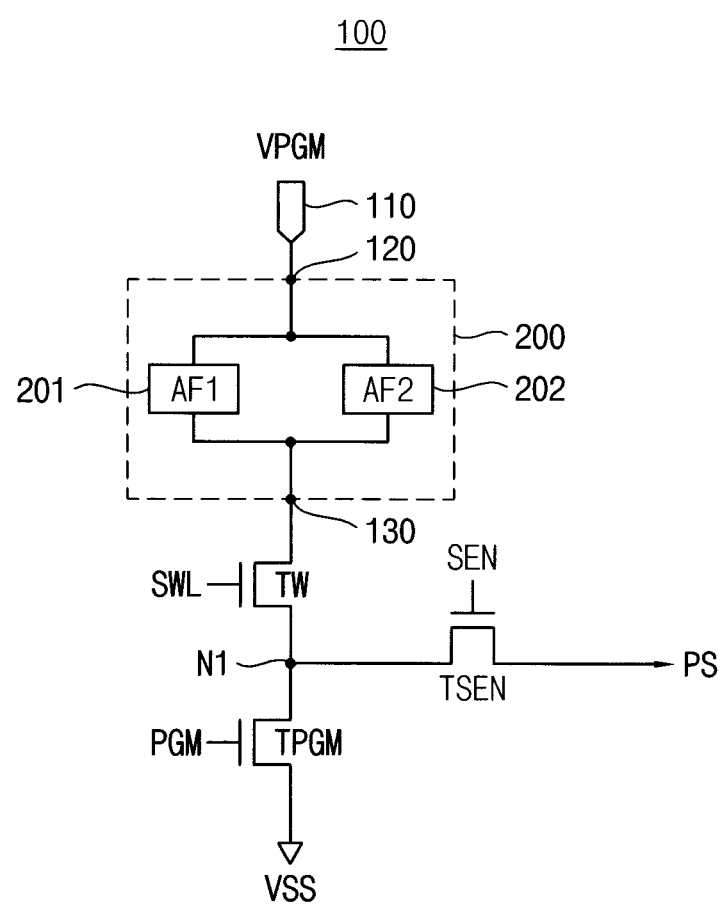

The program unit 100 may include at least two anti-fuse elements (AF1 and AF2 in FIG. 2) as illustrated in FIGS. 2A and 2B. The at least two anti-fuse elements AF1 and AF2 may be broken down at different levels of a program voltage VPGM. More particularly, gate oxide layers (gate insulating layers) of the anti-fuse elements AF1 and AF2 may be broken down at different levels of the program voltage VPGM. The program unit 100 is programmed in response to a program signal PGM, and the program unit 100 outputs a program output signal PS in response to a sensing enable signal SEN. That is, the program unit 100 may be programmed in response to the program signal PGM which is activated, and the program unit 100 may output the program output signal PS in response to the sensing enable signal SEN which is activated. The program output signal PS may be a voltage signal or a current signal.

The sensing unit 400 generates a sensing output signal SOUT indicating whether the program unit 100 is normally programmed or not, based on the program output signal PS. The sensing output signal SOUT may indicate whether the at least two anti-fuse elements AF1 and AF2 are normally programmed or not.

In the present specification and claims, the term "normally programmed" refers to a predetermined program state of memory and/or fuse circuits. If a memory cell or fuse circuit is "normally programmed" then it has undergone a programming operation to place it in a program state, and no errors in the program state are apparent.

The fuse circuit 10 may operate in two operation modes. A first operation mode corresponds to a program mode in which at least one of the two anti-fuse elements AF1 and AF2 is programmed in response to the program voltage VPGM. A second operation mode corresponds to a sensing mode, and the sensing unit 400 outputs the sensing output signal SOUT indicating whether at least one of the two anti-fuse elements AF1 and AF2 is normally programmed or not, based on the program output signal PS.

In general, when a program voltage is applied to and end or node of the anti-fuse unit, a dielectric in the anti-fuse unit is broken down, and thus the anti-fuse is programmed. In other words, the "programmed" state of the anti-fuse unit corresponds to a state in which its dielectric is broken down. This may result in an increase in current flowing through the anti-fuse unit. However, the anti-fuse unit may be abnormally or imperfectly programmed, because the level of the program voltage may be too low, the duration that the program voltage is applied may be too short, or the dielectric may have irregular characteristics. To address these problems, the fuse circuit 10 according to example embodiments may include at least two anti-fuse elements AF1 and AF2 which are broken down at different levels of the program voltage VPGM, and the program unit 100 is normally programmed when at least one of the at least two anti-fuse elements AF1 and AF2 is normally programmed. That is, the fuse circuit 10 according to example embodiments may include at least two anti-fuse elements AF1 and AF2 which have different program threshold voltages. Therefore, the fuse circuit 10 may enhance program performance.

FIG. 2A is a circuit diagram illustrating an example of the program unit in FIG. 1 according to an example embodiment of the present general inventive concept.

Referring to FIG. 2A, the program unit 100 may include a program voltage terminal 110, an anti-fuse cell 200, and first to third switch units 140, 150, and 160, The program voltage VPGM may be applied to the anti-fuse cell 200 through the program voltage terminal 110. A first node 120 of the anti-fuse cell 200 is connected to the program voltage terminal 110 and a second node 130 of the anti-fuse cell 200 is connected to the selection transistor TW. The term "node" is used in the present specification and claims to describe a point in a schematic diagram having a single electrical potential. The corresponding location in the electrical circuit may correspond to electrical nodes, such as leads, pads, conductive wiring or patterns, or junctions of different conductive materials. The first node 120 and second node 130 of the anti-fuse cell 200 may correspond to a gate electrode and a source/drain electrode, or to wiring that connects a plurality of gate electrodes and/or source/drain electrodes, for example, as described in further detail below with respect to FIGS. 16 and 17.

Figure 11:
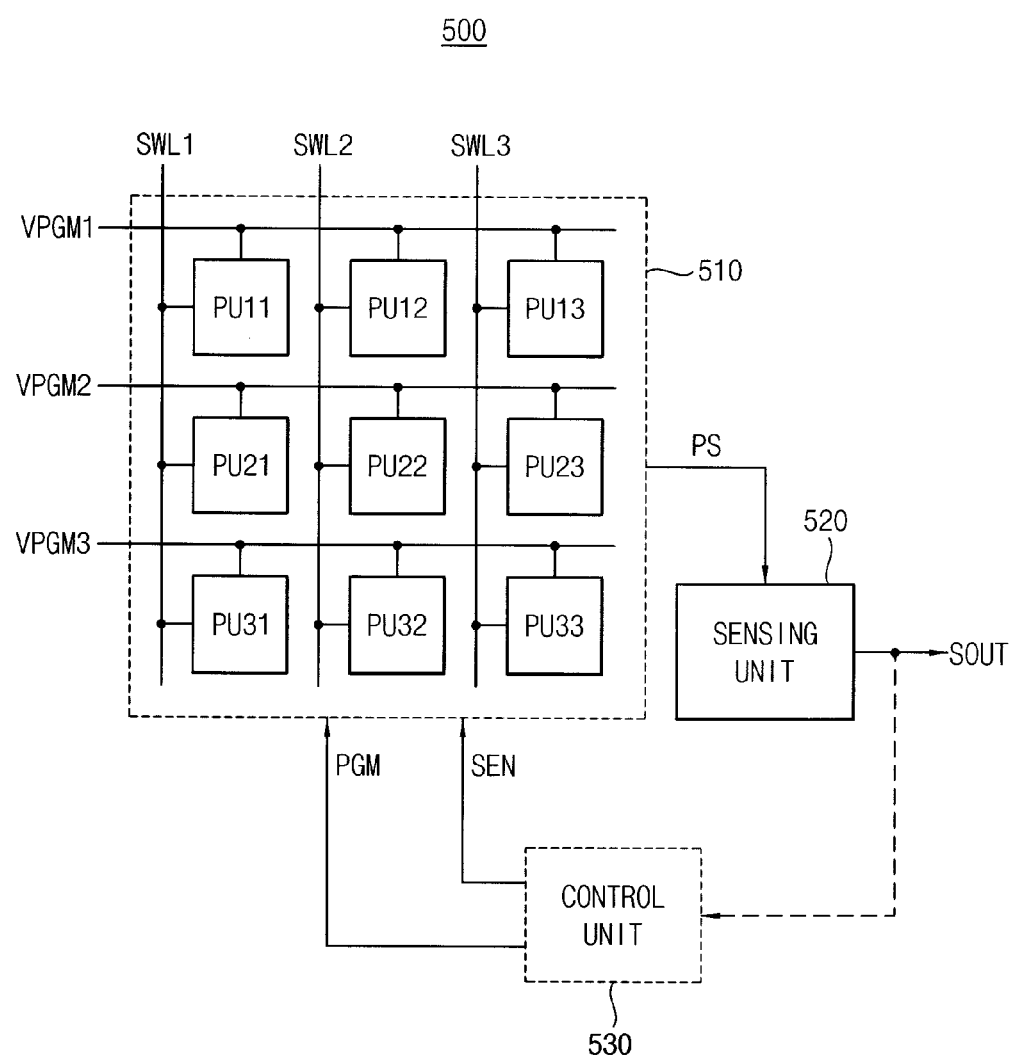
FIG. 11 is a block diagram illustrating a fuse array including a fuse circuit according to an example embodiment of the general inventive concept.

The anti-fuse cell 200 may include at least two anti-fuse elements 201 and 202 (AF1 and AF2) which are connected in parallel with respect to each other between the first and second nodes 120 and 130. Connection relationship of the at least two anti-fuse elements AF1 and AF2 will be described later with reference to FIGS. 3 through 7. The first switch unit 140 is connected between the second node 130 and a connection node N1, and the first switch unit 140 is controlled by a selection signal SWL. The selection signal SWL may be used as a selection signal to select a program unit to be either programmed or sensed in a fuse array which is implemented with a matrix 510 of program units 100, as illustrated in FIG. 11, such that the first switch unit 140 may operate as a program unit selection switch unit.

The second switch unit 150 is connected between the connection node N1 and a ground voltage VSS, and the second switch unit 150 is controlled by the program signal PGM. The connection node N1 is a node at which the first switch unit 140 and the second switch unit 150 are connected. The second switch unit 150 may be controlled to program at least one of the first and second anti-fuse units 201 and 201 (AF1 and AF2), and thus may operate as a programming switch unit.

The third switch unit 160 has a first terminal connected to the connection node N1, and is controlled by the sensing enable signal SEN. The third switch unit 160 outputs a sensing signal PS in the sensing mode.

As will be described with reference to FIGS. 10A and 10B, when the program voltage VPGM, the selection signal SWL and the program signal PGM are activated, a first path from the program voltage terminal 110, via the connection node Ni to the ground voltage VSS is activated, current flows through the first path, and at least one of the two anti-fuse elements 201 and 201 (AF1 and AF2) is programmed in the program mode. When the program voltage VPGM, the selection signal SWL, and the sensing enable signal SEN are activated, a second path from the program voltage terminal 110 via the connection node N1 to the third switch unit 160 is activated, and the program output signal PS may be provided through the second path. Accordingly, control of the first to third switch units 140, 150, and 160 controls whether a program operation of the anti-fuse units 201 and 201 (AF1 and AF2) is performed, or whether a sensing operation of the program states of the anti-fuse units 201 and 201 (AF1 and AF2) is performed.

Referring to FIG. 2B, the first to third switch units 140, 150, and 160 may be implemented as a selection transistor TW, a program transistor TPGM, and a sensing transistor TSEN.

As discussed above with respect to FIG. 2A, the selection transistor TW is connected between the second node 130 and a connection node N1, and the selection transistor TW has a gate that receives a selection signal SWL. The selection signal SWL may be used as a selection signal to select a program unit which is to be programmed or sensed in a fuse array which is implemented with a matrix 510 of program units 100, as illustrated in FIG. 11.

The program transistor TPGM is connected between the connection node N1 and a ground voltage VSS, and the program transistor TPGM has a gate that receives the program signal PGM. The connection node N1 is a node at which the selection transistor TW and the program transistor TPGM are connected. The sensing transistor TSEN has a first terminal connected to the connection node N1, a gate that receives the sensing enable signal SEN, and a second terminal which provides the program output signal PS in the sensing mode.

As will be described with reference to FIGS. 10A and 10B, when the program voltage VPGM, the selection signal SWL and the program signal PGM are activated, a first path from the program voltage terminal 110, via the connection node N1 to the ground voltage VSS is activated, current flows through the first path, and at least one of the two anti-fuse elements 201 and 202 (AF1 and AF2) is programmed in the program mode. When the program voltage VPGM, the selection signal SWL, and the sensing enable signal SEN are activated, a second path from the program voltage terminal 110, via the connection node N1 to the sensing transistor TSEN is activated, and the program output signal PS may be provided through the second path.

Figure 3:
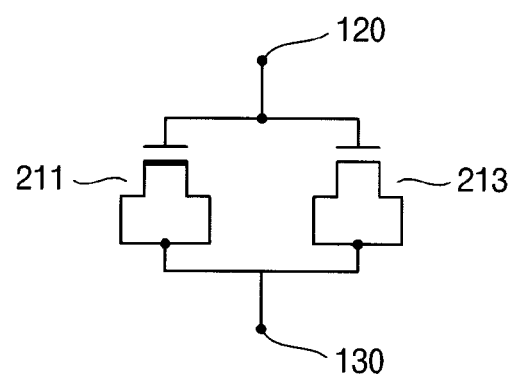
FIG. 3 illustrates the anti-fuse cell in FIG. 2 according to an embodiment of the general inventive concept.

FIG. 3 illustrates the anti-fuse cell in FIG. 2B according to an example embodiment of the general inventive concept.

Referring to FIG. 3, an anti-fuse cell 210 may include first and second transistors 211 and 213 which are connected in parallel with respect to each other between the first and second nodes 120 and 130. The anti-fuse cell 210 may correspond to the anti-fuse cell 200 of FIGS. 2A and 2B, and the first and second transistors 211 and 213 may correspond to the anti-fuse units 201 and 202 (AF1 and AF2) of FIGS. 2A and 2B. The first transistor 211 may be a depletion type metal oxide semiconductor (MOS) transistor which has a gate connected to the first node 120 and a source and a drain commonly connected to the second node 130. In addition, the second transistor 213 may be an enhancement type MOS transistor which has a gate connected to the first node 120 and a source and a drain commonly connected to the second node 130. In some embodiments, the first transistor 211 may be an enhancement type MOS transistor and the second transistor 213 may be a depletion type MOS transistor. Each source and drain of the first and second transistors 211 and 213 are connected to each other, and the first and second transistors 211 and 213 may operate as a MOS capacitor.

As will be described with reference to FIGS. 13 through 15, the first transistor 211 which is a depletion type MOS transistor and the second transistor 213 which is an enhancement type MOS transistor may have gate oxide layers (or insulating layers) which have substantially same thickness, and the first and second transistors 211 and 213 may have substantially a same channel width and a same channel length with respect to each other. In addition, the first transistor 211 which is a depletion type MOS transistor, includes a channel which is previously formed, and thus, the first transistor 211 which is a depletion type MOS transistor, has a gate oxide layer which is broken down at a lower level of a breakdown voltage than the second transistor 213 which is an enhancement type MOS transistor. That is, the first transistor 211 has a lower level of programming threshold voltage than the second transistor 213.

Figure 8A:
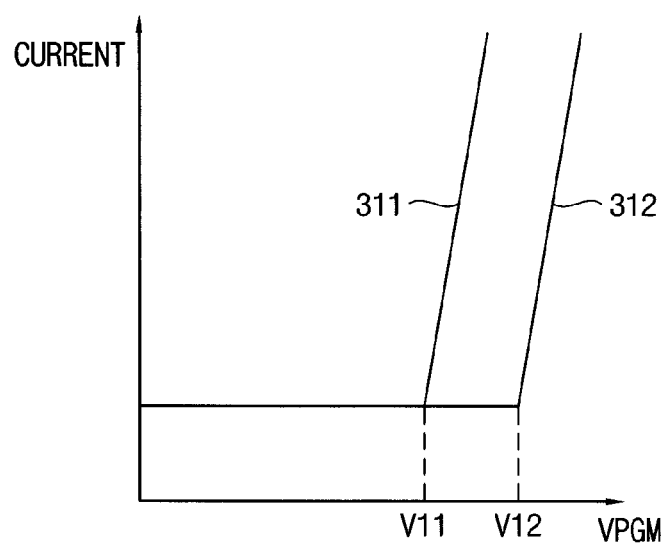
FIG. 8A illustrates breakdown voltages of the first and second transistors of FIG. 3.

FIG. 8A illustrates breakdown voltages of the first and second transistors of FIG. 3.

Referring to FIG. 8A, a reference numeral 311 denotes a level of current which flows through the first transistor 211 and a reference numeral 312 denotes a level of current which flows through the first transistor 213 when the program voltage VPGM is applied to the first node 120 in FIG. 3. The gate oxide of the first transistor 211 is broken down at a first level V11 of the program voltage VPGM, and thus, the first transistor 211 is conducting when the program voltage VPGM having a level equal to or greater than the first level V11 is applied to the first node 120 in FIG. 3. In addition, the gate oxide of the second transistor 213 is broken down at a second level V12 of the program voltage VPGM, and thus, the second transistor 213 is conducting when the program voltage VPGM having a level equal to or greater than the second level V12 is applied to the first node 120 in FIG. 3. As described with reference to FIG. 3, since the first transistor 211 which is a depletion type MOS transistor includes a channel which is previously formed and the second transistor 213 is an enhancement type, it is noted that the first level V11 is lower than the second level V12.

Figure 4:
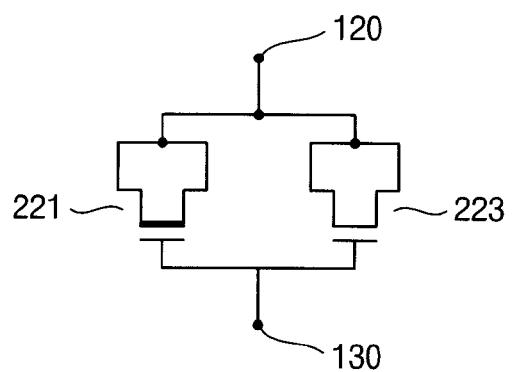
FIG. 4 illustrates the anti-fuse cell in FIG. 2 according to another example embodiment.

FIG. 4 illustrates the anti-fuse cell in FIG. 2 according to another example embodiment.

Referring to FIG. 4, an anti-fuse cell 220 may include first and second transistors 221 and 223 which are connected in parallel with respect to each other between the first and second nodes 120 and 130. The anti-fuse cell 220 may correspond to the anti-fuse cell 200 of FIGS. 2A and 2B, and the first and second transistors 221 and 223 may correspond to the anti-fuse units 201 and 202 (AF1 and AF2) of FIGS. 2A and 2B. The first transistor 221 may be a depletion type metal oxide semiconductor (MOS) transistor which has a gate connected to the second node 130 and a source and a drain commonly connected to the first node 120. In addition, the second transistor 223 may be an enhancement type MOS transistor which has a gate connected to the second node 130 and a source and a drain commonly connected to the first node 120. In some embodiments, the first transistor 221 may be an enhancement type MOS transistor and the second transistor 223 may be a depletion type MOS transistor. Each source and drain of the first and second transistors 221 and 223 are connected to each other, the first and second transistors 221 and 223 may operate as a MOS capacitor.

As described with reference to FIG. 3, the first transistor 221 which is a depletion type MOS transistor and the second transistor 223 which is an enhancement type MOS transistor may have gate oxide layers (or insulating layers) which have substantially same thickness, and the first and second transistors 221 and 223 may have substantially a same channel width and a same channel length with respect to each other. In addition, the first transistor 221 which is a depletion type MOS transistor, includes a channel which is previously formed, and thus, the first transistor 221 which is a depletion type MOS transistor, has a gate oxide layer which is broken down at a lower level of a breakdown voltage than the second transistor 223 which is an enhancement type MOS transistor. That is, the first transistor 221 has a lower level of programming threshold voltage than the second transistor 223.

Figure 8B:
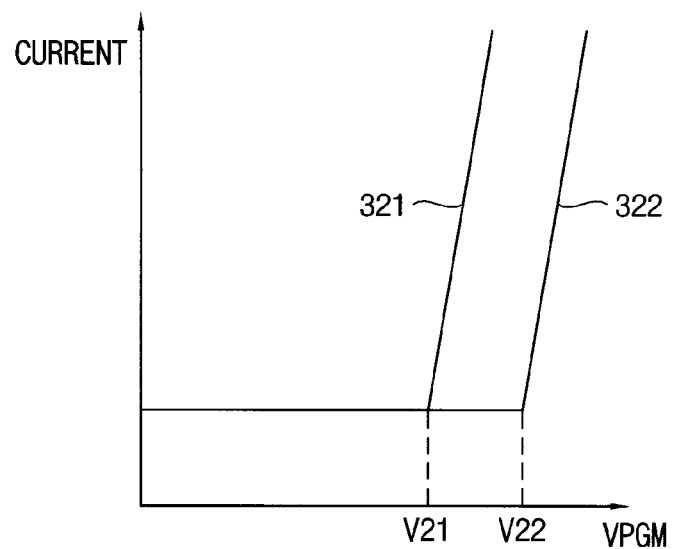
FIG. 8B illustrates breakdown voltages of the first and second transistors of FIG. 4.

FIG. 8B illustrates breakdown voltages of the first and second transistors of FIG. 4.

Referring to FIG. 8B, a reference numeral 321 denotes a level of current which flows through the first transistor 221 and a reference numeral 322 denotes a level of current which flows through the first transistor 223 when the program voltage VPGM is applied to the first node 120 in FIG. 4. The gate oxide of the first transistor 221 is broken down at a first level V21 of the program voltage VPGM, and thus, the first transistor 221 is conducting when the program voltage VPGM having a level equal to or greater than the first level V21 is applied to the first node 120 in FIG. 4. In addition, the gate oxide of the second transistor 223 is broken down at a second level V22 of the program voltage VPGM, and thus, the second transistor 223 is conducting when the program voltage VPGM having a level equal to or greater than the second level V22 is applied to the first node 120 in FIG. 4. As described with reference to FIG. 4, since the first transistor 241 which is a depletion type MOS transistor includes a channel which is previously formed and the second transistor 223 is an enhancement type, it is noted that the first level V21 is lower than the second level V22.

In addition, when an embodiment of FIG. 3 is compared with an embodiment of FIG. 4, it is noted that a connection relationship of the first and second transistors 211 and 213 and the first and second nodes 120 and 130 in FIG. 3 is reverse with respect to a connection relationship of the first and second transistors 221 and 223 and the first and second nodes 120 and 130 in FIG. 4. That is, the program voltage VPGM is applied to the gates of the first and second transistors 211 and 213 in FIG. 3 while the program voltage VPGM is applied to the commonly-connected source and drain of the first and second transistors 221 and 223 in FIG. 4.

As will be described with reference to FIGS. 16 and 17, the breakdown voltage level in the embodiment of FIG. 3 in which the program voltage VPGM is applied to the gates of the first and second transistors 211 and 213 may be different from the breakdown voltage level in the embodiment of FIG. 4 in which the program voltage VPGM is applied to the commonly-connected source and drain of the first and second transistors 221 and 223. The breakdown voltage level in the embodiment of FIG. 3 may be different from the breakdown voltage level in the embodiment of FIG. 4 because different materials may be inserted between the gate insulating layers of the first and second transistors 211 and 213, and 221 and 223, respectively and the terminal to which the program voltage VPGM is applied (such as the node 120, or an electrical terminal connected to the node 120). In addition, relative distances between the gate insulating layers of the first and second transistors 211 and 213, and 221 and 223 and the terminal to which the program voltage VPGM is applied may differ. Therefore, more materials may be inserted and the relative distance may be longer in the embodiment of FIG. 4 than in the embodiment of FIG. 3, and thus, breakdown may occur at a higher level of the program voltage VPGM in the embodiment of FIG. 4 than in the embodiment of FIG. 3. Accordingly, the first level V21 in FIG. 8B may be higher than the first level V11 in FIG. 8A and the second level V22 in FIG. 8B may be higher than the second level V12 in FIG. 8A. In addition, the first level V21 in FIG. 8B may be higher even than the second level V12 in FIG. 8A.

As described above, same type MOS transistors have different level of breakdown voltage depending on the terminal to which the program voltage VPGM is applied. Therefore, the anti-fuse cell 200 of FIG. 2 may include at least two MOS transistors having same types, which will be described with reference to FIGS. 5 and 6.

Figure 5:
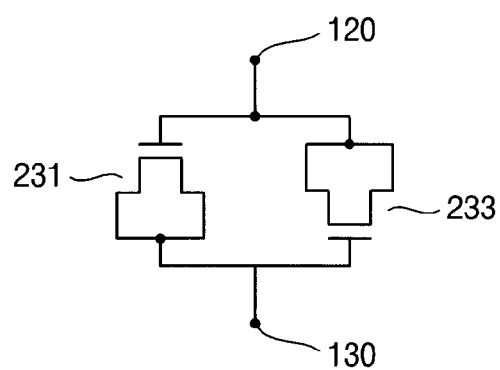
FIG. 5 illustrates the anti-fuse cell in FIG. 2 according to still another example embodiment.

FIG. 5 illustrates the anti-fuse cell in FIG. 2 according to still another example embodiment of the general inventive concept.

Referring to FIG. 5, an anti-fuse cell 230 may include first and second transistors 231 and 233 which are connected in parallel with respect to each other between the first and second nodes 120 and 130. The anti-fuse cell 230 may correspond to the anti-fuse cell 200 of FIGS. 2A and 2B, and the first and second transistors 231 and 233 may correspond to the anti-fuse units 201 and 202 (AF1 and AF2) of FIGS. 2A and 2B. The first transistor 231 may be a first enhancement type MOS transistor which has a gate connected to the first node 120 and a source and a drain commonly connected to the second node 130. In addition, the second transistor 233 may be a second enhancement type MOS transistor which has a gate connected to the second node 130 and a source and a drain commonly connected to the first node 120. In some embodiments, the first transistor 231 may be a first enhancement type MOS transistor which has a gate connected to the second node 130 and a source and a drain commonly connected to the first node 130, and the second transistor 233 may be a second enhancement type MOS transistor which has a gate connected to the first node 120 and a source and a drain commonly connected to the second node 130. Each source and drain of the first and second transistors 231 and 233 are connected to each other, the first and second transistors 231 and 233 may operate as a MOS capacitor. In addition, the first and second MOS transistors 231 and 233 which are enhancement type MOS transistors may have substantially same gate oxide layer of same thickness and same channel width and same channel length with respect to each other.

Figure 8C:
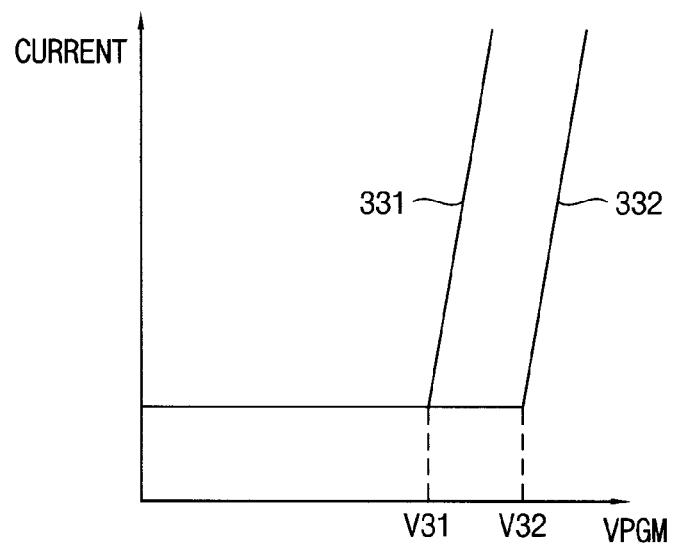
FIG. 8C illustrates breakdown voltages of the first and second transistors of FIG. 5.

FIG. 8C illustrates breakdown voltages of the first and second transistors of FIG. 5.

Referring to FIG. 8C, a reference numeral 331 denotes a level of current which flows through the first transistor 231 and a reference numeral 332 denotes a level of current which flows through the first transistor 233 when the program voltage VPGM is applied to the first node 120 in FIG. 5. The gate oxide of the first transistor 231 is broken down at a first level V31 of the program voltage VPGM, and thus, the first transistor 231 is conducting when the program voltage VPGM having a level equal to or greater than the first level V31 is applied to the first node 120 in FIG. 5. In addition, the gate oxide of the second transistor 233 is broken down at a second level V32 of the program voltage VPGM, and thus, the second transistor 233 is conducting when the program voltage VPGM having a level equal to or greater than the second level V32 is applied to the first node 120 in FIG. 5. As described with reference to FIGS. 3, 4, 8A and 8B, the first level V31 is lower than the second level V32, the first level V31 is substantially the same as the second level V12 in FIG. 8A, and the second level V32 is substantially the same as the second level V22 in FIG. 8B.

Figure 6:
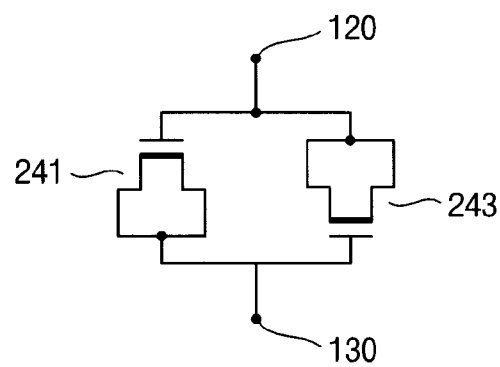
FIG. 6 illustrates the anti-fuse cell in FIG. 2 according to still another example embodiment.

FIG. 6 illustrates the anti-fuse cell in FIG. 2 according to still another example embodiment of the general inventive concept.

Referring to FIG. 6, an anti-fuse cell 240 may include first and second transistors 241 and 243 which are connected in parallel with respect to each other between the first and second nodes 120 and 130. The anti-fuse cell 240 may correspond to the anti-fuse cell 200 of FIGS. 2A and 2B, and the first and second transistors 241 and 243 may correspond to the anti-fuse units 201 and 202 (AF1 and AF2) of FIGS. 2A and 2B. The first transistor 241 may be a first depletion type MOS transistor which has a gate connected to the first node 120 and a source and a drain commonly connected to the second node 130. In addition, the second transistor 243 may be a second depletion type MOS transistor which has a gate connected to the second node 130 and a source and a drain commonly connected to the first node 120. In some embodiments, the first transistor 241 may be a first depletion type MOS transistor which has a gate connected to the second node 130 and a source and a drain commonly connected to the second node 130, and the second transistor 243 may be a second depletion type MOS transistor which has a gate connected to the first node 120 and a source and a drain commonly connected to the second node 130. Each source and drain of the first and second transistors 241 and 243 are connected to each other, and the first and second transistors 241 and 243 may operate as a MOS capacitor. In addition, the first and second MOS transistors 241 and 243 which are depletion type MOS transistors may have substantially same gate oxide layer of same thickness and same channel width and same channel length with respect to each other.

Figure 8D:
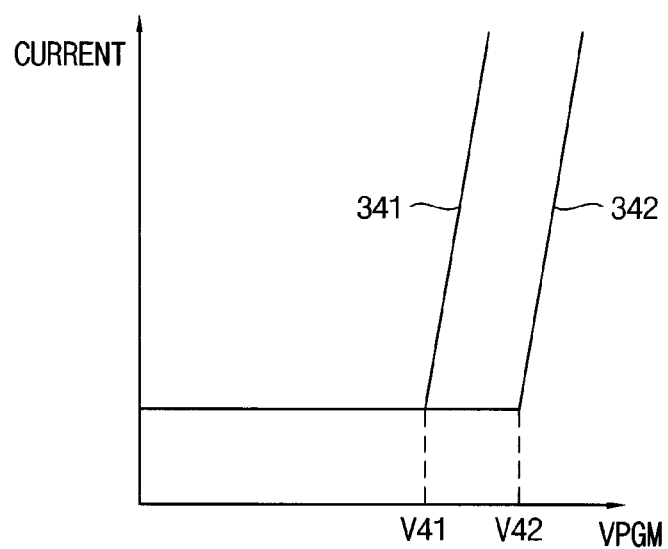
FIG. 8D illustrates breakdown voltages of the first and second transistors of FIG. 6.

FIG. 8D illustrates breakdown voltages of the first and second transistors of FIG. 6.

Referring to FIG. 8D, a reference numeral 341 denotes a level of current which flows through the first transistor 241 and a reference numeral 342 denotes a level of current which flows through the second transistor 243 when the program voltage VPGM is applied to the first node 120 in FIG. 6, The gate oxide of the first transistor 241 is broken down at a first level V41 of the program voltage VPGM, and thus, the first transistor 241 is conducting when the program voltage VPGM having a level equal to or greater than the first level V41 is applied to the first node 120 in FIG. 6. In addition, the gate oxide of the second transistor 243 is broken down at a second level V42 of the program voltage VPGM, and thus, the second transistor 243 is conducting when the program voltage VPGM having a level equal to or greater than the second level V42 is applied to the first node 120 in FIG. 6. As described with reference to FIGS. 3, 4, 8A and 8B, the first level V41 is lower than the second level V42, the first level V41 is substantially the same as the first level V11 in FIG. 8A, and the second level V42 is substantially the same as the first level V21 in FIG. 8B.

Figure 7:
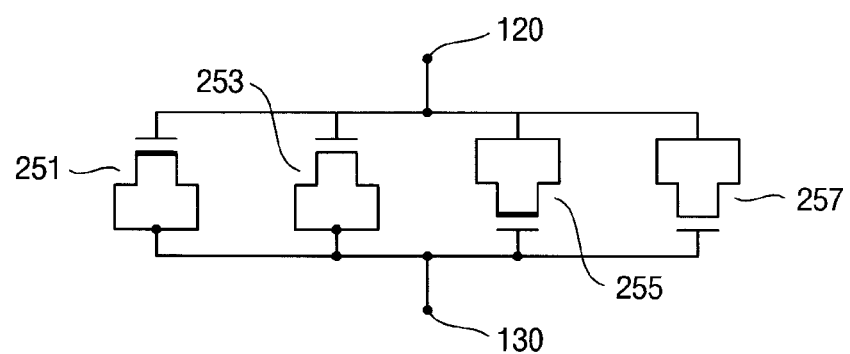
FIG. 7 illustrates the anti-fuse cell in FIG. 2 according to still another example embodiment.

FIG. 7 illustrates the anti-fuse cell in FIG. 2 according to still another example embodiment of the general inventive concept.

Referring to FIG. 7, an anti-fuse cell 250 may include first through fourth transistors 251, 253, 255 and 257 which are connected in parallel with respect to each other between the first and second nodes 120 and 130. The first transistor 251 may be a first depletion type MOS transistor which has a gate connected to the first node 120 and a source and a drain commonly connected to the second node 130. The second transistor 253 may be a first enhancement type MOS transistor which has a gate connected to the first node 120 and a source and a drain commonly connected to the second node 130. The third transistor 255 may be a second depletion type MOS transistor which has a gate connected to the second node 130 and a source and a drain commonly connected to the first node 120. The fourth transistor 257 may be a second enhancement type MOS transistor which has a gate connected to the second node 130 and a source and a drain commonly connected to the first node 120. Each source and drain of the first through fourth transistors 251, 253, 255 and 257 are connected to each other, the first and fourth transistors 251, 253, 255 and 257 may operate as a MOS capacitor.

Figure 8E:
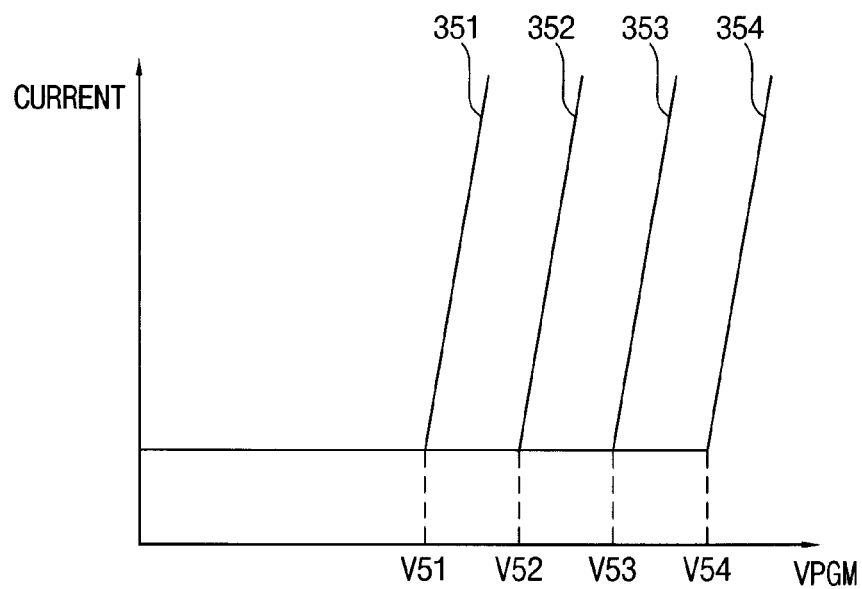
FIG. 8E illustrates breakdown voltages of the first through fourth transistors of FIG. 7.

FIG. 8E illustrates breakdown voltages of the first through fourth transistors of FIG. 7.

Referring to FIG. 8E, a reference numeral 351 denotes a level of current which flows through the first transistor 251, a reference numeral 352 denotes a level of current which flows through the second transistor 253, a reference numeral 353 denotes a level of current which flows through the third transistor 255, and a reference numeral 354 denotes a level of current which flows through the fourth transistor 257 when the program voltage VPGM is applied to the first node 120 in FIG. 7. The gate oxide of the first transistor 251 is broken down at a first level V51 of the program voltage VPGM, and thus, the first transistor 251 is conducting when the program voltage VPGM having a level equal to or greater than the first level V51 is applied to the first node 120 in FIG. 7. In addition, the gate oxide of the second transistor 253 is broken down at a second level V52 of the program voltage VPGM, and thus, the second transistor 253 is conducting when the program voltage VPGM having a level equal to or greater than the second level V52 is applied to the first node 120 in FIG. 7. In addition, the gate oxide of the third transistor 255 is broken down at a third level V53 of the program voltage VPGM, and thus, the second transistor 255 is conducting when the program voltage VPGM having a level equal to or greater than the third level V53 is applied to the first node 120 in FIG. 7. In addition, the gate oxide of the fourth transistor 257 is broken down at a fourth level V54 of the program voltage VPGM, and thus, the fourth transistor 257 is conducting when the program voltage VPGM having a level equal to or greater than the fourth level V54 is applied to the first node 120 in FIG. 7.

As described with reference to FIGS. 3, 4, 8A and 8B, the first level V51 is lower than the second level V52, and the third level V53 is higher than the second level V52 and lower than the fourth level V54. In addition, the first level V51 is substantially the same as the first level V11 in FIG. 8A, the second level V52 is substantially the same as the second level V12 in FIG. 8A, the third level V53 is substantially the same as the first level V21 in FIG. 8B and the fourth level V54 is substantially the same as the second level V22 in FIG. 8B.

FIGS. 9A through 9D are circuit diagrams illustrating the sensing unit in FIG. 1 according to example embodiments of the general inventive concept.

Referring to FIGS. 9A through 9D, the sensing unit 400 in FIG. 1 may include at least one comparator that compares the program output signal PS with at least one reference voltage to output a sensing output signal SOUT.

Figure 9A:
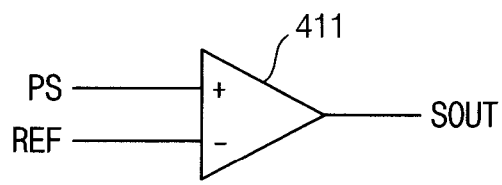
FIGS. 9A through 9D are circuit diagrams illustrating the sensing unit in FIG. 1 according to example embodiments of the general inventive concept.

FIG. 9A is a circuit diagram illustrating the sensing unit in FIG. 1 according to some example embodiments.

Referring to FIG. 9A, a sensing unit 410 may include a comparator 411. The comparator 411 compares the program output signal PS with a reference voltage REF to output the sensing output signal SOUT having a logic level according to the comparison result. The sensing unit 410 may be employed when the anti-fuse cell 200 in FIG. 2 is implemented with one of the anti-fuse cells 210, 220, 230, 240 and 250. The sensing output signal SOUT may have a logic high level or a logic low level according to the result of the comparison of the program output signal PS and the reference voltage REF. For example, the sensing output signal SOUT may have a logic high level when at least one of the anti-fuse elements AF1 and AF2 is normally programmed in response to the program voltage VPGM that is applied to the program voltage terminal 110. Conversely, the sensing output signal SOUT may have a logic low level when neither of the anti-fuse elements AF1 and AF2 is normally programmed in response to the program voltage VPGM that is applied to the program voltage terminal 110.

The level of the reference voltage REF may correspond to a level of the program output signal PS when one of the anti-fuse elements AF1 and AF2 is broken down and conducting at lowest level of the program voltage VPGM. The term "lowest level of the program voltage VPGM" refers to a minimum voltage required to program one of the anti-fuse elements AF1 and AF2 having a lower breakdown threshold. For example, if the anti-fuse element AF1 has a lower breakdown threshold than anti-fuse element AF2, then the reference voltage REF may correspond to the voltage required to program the anti-fuse element AF1, which is lower than the voltage required to program the anti-fuse element AF2.

Figure 9B:
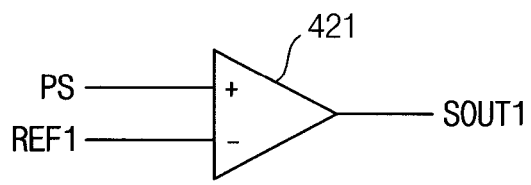
Figure 9B:
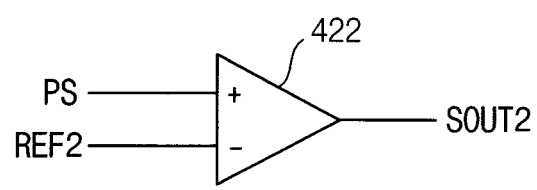

FIG. 9B is a circuit diagram illustrating the sensing unit in FIG. 1 according to another example embodiment of the general inventive concept. A sensing unit 420 may be employed when the anti-fuse cell 200 in FIG. 2 is implemented with one of the anti-fuse cells 210, 220, 230, and 240, for example.

Referring to FIG. 9B, a sensing unit 420 may include a first comparator 421 and a second comparator 422. The first comparator 421 compares the program output signal PS with a first reference voltage REF1 to output a first sensing output signal SOUT1 having a logic level according to the comparison result. The second comparator 422 compares the program output signal PS with a second reference voltage REF2 to output a second sensing output signal SOUT2 having a logic level according to the comparison result. The first sensing output signal SOUT1 may correspond to a first bit of the sensing output signal SOUT in FIG. 1, and the second sensing output signal SOUT2 may correspond to a second bit of the sensing output signal SOUT in FIG. 1.

The level of the first reference voltage REF1 may correspond to a level of the program output signal PS when one of the anti-fuse elements AF1 and AF2 is broken down and conducting at lower level of the program voltage VPGM. The level of the second reference voltage REF2 may correspond to a level of the program output signal PS when all of the anti-fuse elements AF1 and AF2 are broken down and conducting at a higher level of the program voltage VPGM.

Assuming that the anti-fuse cell 200 in FIG. 2 employs the anti-fuse cell 210 of FIG. 3 and the sensing unit 400 in FIG. 1 employs the sensing unit 420 of FIG. 9B. When both the first and second transistors 211 and 213 are not normally programmed after the program voltage VPGM is applied during enough time, the level of the program output signal PS may be lower than the level of the first reference voltage REF1. Accordingly, the first and second sensing output signals SOUT1 and SOUT2 may be "00". When one of the first and second transistors 211 and 213 is normally programmed and the other of the first and second transistors 211 and 213 is not normally programmed after the program voltage VPGM is applied during enough time, the level of the program output signal PS may be between the levels of the first and second reference voltages REF1 and REF2. Accordingly, the first and second sensing output signals SOUT1 and SOUT2 may be "10". When both the first and second transistors 211 and 213 are normally programmed after the program voltage VPGM is applied during enough time, the level of the program output signal PS may be higher than the level of the second reference voltage REF2. Accordingly, the first and second sensing output signals SOUT1 and SOUT2 may be "11".

Therefore, the logic levels of the sensing output signal SOUT may determine whether the anti-fuse cell 210 is normally programmed or not and whether at least one of the first and second transistors 211 and 213 is normally programmed or not.

Figure 9C:
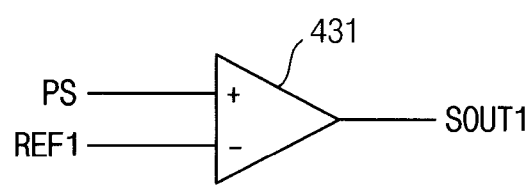
Figure 9C:
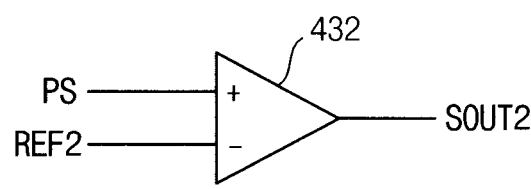
Figure 9C:
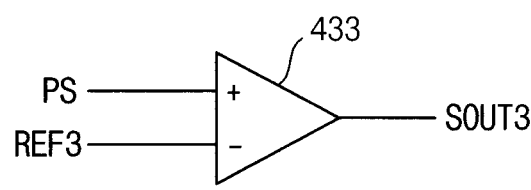

FIG. 9C is a circuit diagram illustrating the sensing unit in FIG. 1 according to another example embodiment. A sensing unit 430 may be employed when the anti-fuse cell 200 in FIG. 2 is implemented with one of the anti-fuse cells 210, 220, 230, and 240, for example.

Referring to FIG. 9C, a sensing unit 430 may include a first comparator 431, a second comparator 432 and a third comparator 433. The first comparator 431 compares the program output signal PS with a first reference voltage REF1 to output a first sensing output signal SOUT1 having a logic level according to the comparison result. The second comparator 432 compares the program output signal PS with a second reference voltage REF2 to output a second sensing output signal SOUT2 having a logic level according to the comparison result. The third comparator 433 compares the program output signal PS with a third reference voltage REF3 to output a third sensing output signal SOUT3 having a logic level according to the comparison result. The first sensing output signal SOUT1 may correspond to a first bit of the sensing output signal SOUT in FIG. 1, the second sensing output signal SOUT2 may correspond to a second bit of the sensing output signal SOUT in FIG. 1, and the third sensing output signal SOUT3 may correspond to a third bit of the sensing output signal SOUT in FIG. 1.

The level of the first reference voltage REF1 may correspond to a level of the program output signal PS when one of the anti-fuse elements AF1 and AF2 is broken down and conducting at lower level of the program voltage VPGM. The level of the second reference voltage REF2 may correspond to a level of the program output signal PS when one of the anti-fuse elements AF1 and AF2 is broken down and conducting at a higher level of the program voltage VPGM. The level of the second reference voltage REF2 may correspond to a level of the program output signal PS when both of the anti-fuse elements AF1 and AF2 are broken down and conducting at a level of the program voltage VPGM, or in other words, when substantially the entire voltage VPGM is transmitted through the anti-fuse elements AF1 and AF2.

Assuming that the anti-fuse cell 200 in FIG. 2 employs the anti-fuse cell 210 of FIG. 3 and the sensing unit 400 in FIG. 1 employs the sensing unit 430 of FIG. 9C. When both the first and second transistors 211 and 213 are not normally programmed after the program voltage VPGM is applied during enough time, the level of the program output signal PS may be lower than the level of the first reference voltage REF1, Accordingly, the first through third sensing output signals SOUT1, SOUT2 and SOUT3 may be "000". When the first transistor 211 is normally programmed and the second transistor 213 is not normally programmed after the program voltage VPGM is applied during enough time, the level of the program output signal PS may be between the levels of the first and second reference voltages REF1 and REF2. Accordingly, the first through third sensing output signals SOUT1, SOUT2, and SOUT3 may be "100". When the first transistor 211 is not normally programmed and the second transistor 213 is normally programmed after the program voltage VPGM is applied for a predetermined duration of time, the level of the program output signal PS may be between the levels of the second and third reference voltages REF2 and REF3. Accordingly, the first through third sensing output signals SOUT1, SOUT2, and SOUT3 may be "110". When both the first and second transistors 211 and 213 are normally programmed after the program voltage VPGM is applied for a predetermined period of time, the level of the program output signal PS may be higher than the level of the third reference voltage REF3. Accordingly, the first through third sensing output signals SOUT1, SOUT2, and SOUT3 may be "111".

Therefore, the logic levels of the sensing output signal SOUT may determine whether the anti-fuse cell 210 is normally programmed or not and whether each one of the first and second transistors 211 and 213 is normally programmed or not.

Figure 9D:
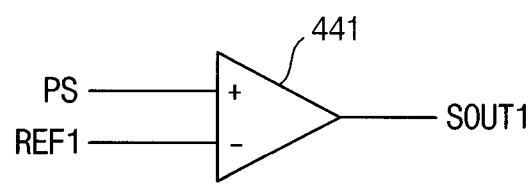
Figure 9D:
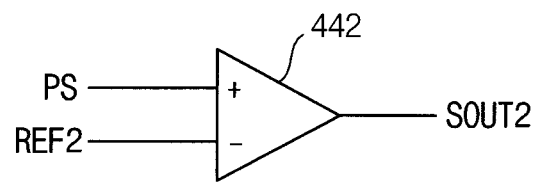
Figure 9D:
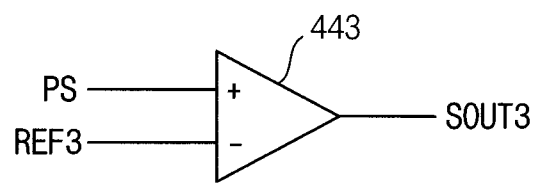
Figure 9D:
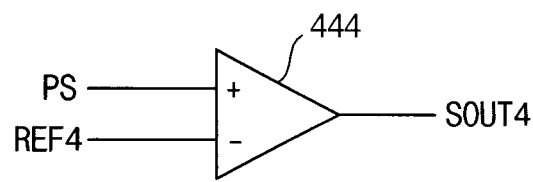

FIG. 9D is a circuit diagram illustrating the sensing unit in FIG. 1 according to still another example embodiment of the general inventive concept. A sensing unit 440 may be employed when the anti-fuse cell 200 in FIG. 2 is implemented with the anti-fuse cell of FIG. 7.

Referring to FIG. 9D, a sensing unit 440 may include a first comparator 441, a second comparator 442, a third comparator 443 and a fourth comparator 444. The first comparator 441 compares the program output signal PS with a first reference voltage REF1 to output a first sensing output signal SOUT1 having a logic level according to the comparison result. The second comparator 442 compares the program output signal PS with a second reference voltage REF2 to output a second sensing output signal SOUT2 having a logic level according to the comparison result. The third comparator 443 compares the program output signal PS with a third reference voltage REF3 to output a third sensing output signal SOUT3 having a logic level according to the comparison result. The fourth comparator 444 compares the program output signal PS with a fourth reference voltage REF4 to output a fourth sensing output signal SOUT4 having a logic level according to the comparison result. The first sensing output signal SOUT1 may correspond to a first bit of the sensing output signal SOUT in FIG. 1, the second sensing output signal SOUT2 may correspond to a second bit of the sensing output signal SOUT in FIG. 1, the third sensing output signal SOUT3 may correspond to a third bit of the sensing output signal SOUT in FIG. 1, and the fourth sensing output signal SOUT4 may correspond to a fourth bit of the sensing output signal SOUT in FIG. 1.

Each level of the first through fourth reference voltages REF1~REF4 may be properly set according to breakdown voltages of the first through fourth transistors 251, 253, 255, and 257. Accordingly, the logic levels of the first through fourth sensing output signals SOUT1~SOUT4 may be different according to a number of the first through fourth transistors 251, 253, 255, and 257 which are conducting when the program voltage VPGM is applied. Therefore, the logic levels of the first through fourth sensing output signals SOUT1~SOUT4 may determine whether the anti-fuse cell 210 is normally programmed or not and whether at least one of the first through fourth transistors 251, 253, 255, and 257 is normally programmed or not. As the number of the comparators included in the sensing unit 440 increases, the sensing unit 440 may determine with increased precision whether at least one of the first through fourth transistors 251, 253, 255, and 257 is normally programmed or not.

Figure 10A:
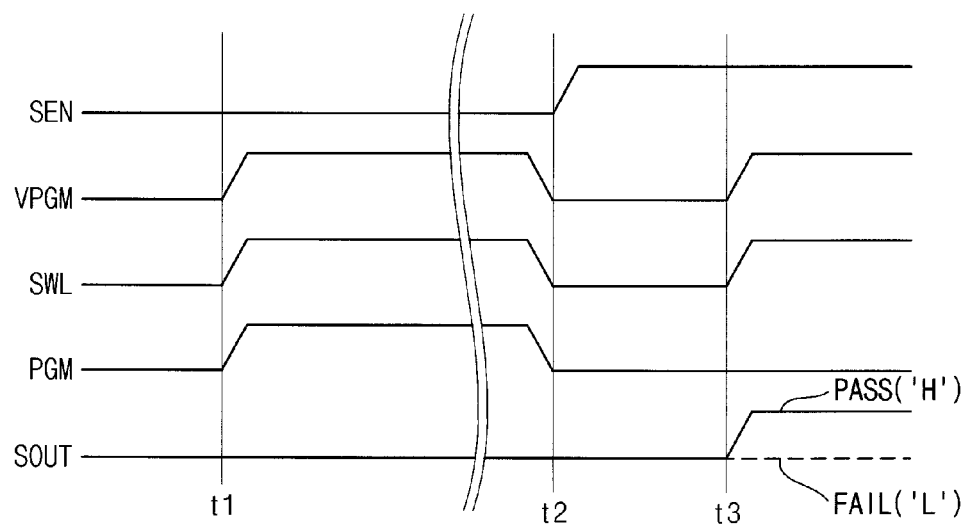
FIGS. 10A and 10B are timing diagrams illustrating operations of the fuse circuit of FIG. 1 according to some example embodiments of the general inventive concept.
Figure 10B:
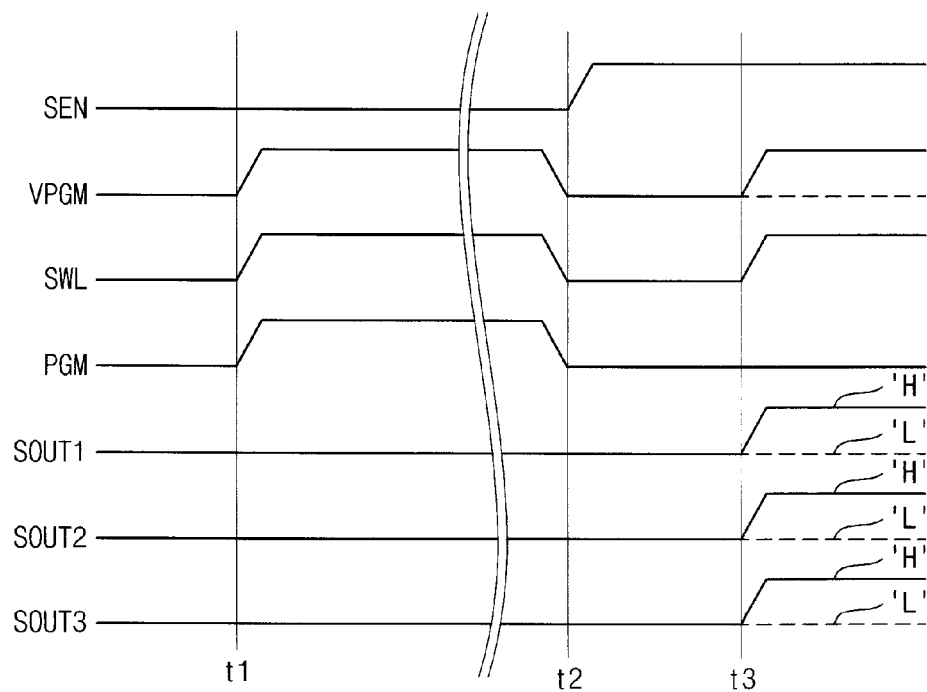

FIGS. 10A and 10B are timing diagrams illustrating operations of the fuse circuit of FIG. 1 according to example embodiments of the general inventive concept.

With reference to FIGS. 1, 2, 9A, and 10A, there will be description about the operation of the fuse circuit 10 when the sensing unit 400 in FIG. 1 employs the sensing unit 410 of FIG. 9A.

At time t1, the program voltage VPGM is applied to the anti-fuse elements AF1 and AF2, and a selection signal SWL is activated simultaneously with the program signal PGM being activated. The selection transistor TW is turned on in response to the activated selection signal SWL, and the program transistor TPGM is turned on in response to the activated program signal PGM. That is, the first path from the program voltage terminal 110 via the connection node N1 to the ground voltage VSS is enabled, the activated program voltage VPGM about 5V to 7V is applied to the anti-fuse elements AF1 and AF2, and the anti-fuse elements AF1 and AF2 are programmed after a predetermined period of time elapses. For example, the respective resistances of the anti-fuse elements AF1 and AF2 may be about a few hundreds of kilo-ohms (kΩ) to a few mega-ohms (MΩ) before the anti-fuse elements AF1 and AF2 are programmed, and about a kilo-ohm (kΩ) after the anti-fuse elements AF1 and AF2 are programmed. The sensing enable signal SEN remains at inactive state while the anti-fuse elements AF1 and AF2 are programmed.

After the anti-fuse elements AF1 and AF2 are programmed, at time t2, the sensing enable signal SEN is activated, and the sensing transistor TSEN is turned on in response to the enabled sensing enable signal SEN. At time t3, the program voltage VPGM and the selection signal SWL are activated, and the selection transistor TW is turned on in response to the activated selection signal SWL. That is, the second path from the program voltage terminal 110 via the connection node N1 to the sensing transistor TSEN is enabled, the program output signal PS is provided to the sensing unit 410 along the second path. The sensing unit 410 compares the program output signal PS and the reference voltage REF to output the sensing output signal SOUT while the program signal PGM remains at inactive state.

As described with reference to FIG. 9A, the logic level of the sensing output signal SOUT may determine whether the anti-fuse cell 210 is normally programmed or not and whether at least one of the first and second transistors 211 and 213 is normally programmed or not. For example, when at least one of the first and second transistors 211 and 213 is normally programmed, the sensing output signal SOUT may have a logic high level (PASS ('H')). For example, when both of the first and second transistors 211 and 213 are not normally programmed, the sensing output signal SOUT may have a logic low level (FAIL ('L')).

With reference to FIGS. 1, 2, 9C and 10B, there will be description about the operation of the fuse circuit 10 when the sensing unit 400 in FIG. 1 employs the sensing unit 430 of FIG. 9C.

The operation with reference to FIG. 10B from times t1 to t3 is substantially the same as the operation with reference to FIG. 10A, the operation from times t1 to t3 in FIG. 10B will be omitted.

At time t3, the program voltage VPGM and the selection signal SWL are activated, and the selection transistor TW is turned on in response to the activated selection signal SWL. That is, the second path from the program voltage terminal 110 via the connection node N1 to the sensing transistor TSEN is enabled, the program output signal PS is provided to the sensing unit 410 along the second path. The first through third comparators 431, 432, and 433 of the sensing unit 430 respectively compare the program output signal PS with the first and third reference voltages REF1, REF2, and REF3 to output the first through third sensing output signals SOUT1, SOUT2, and SOUT3 respectively while the program signal PGM remains at inactive state.

As described with reference to FIG. 9C, the logic levels of the first through third sensing output signals SOUT1, SOUT2, and SOUT3 may determine whether the anti-fuse cell 210 is normally programmed or not and whether at least one of the first and second transistors 211 and 213 is normally programmed or not. For example, the first through third sensing output signals SOUT1, SOUT2 and SOUT3 may correspond to one of "000", "100", "110", and "111" depending on whether each of the first and second transistors 211 and 213 is normally programmed or not.

As described with reference to FIGS. 1 through 10B, in the fuse circuit 10 according to example embodiments, the anti-fuse cell 200 may include at least two anti-fuse elements AF1 and AF2 that are broken down at different levels of the program voltage VPGM, and thus the program performance may be enhanced, and whether each of the least two anti-fuse elements AF1 and AF2 is normally programmed or not based on the logic level of the sensing output signal SOUT.

FIG. 11 is a block diagram illustrating a fuse array including a fuse circuit according to some example embodiments.

Referring to FIG. 11, a fuse array 500 includes a fuse array unit 510 and a sensing unit 520. The fuse array 500 may selectively include a control unit 530.

The fuse array unit 510 includes a plurality of program units PU11, PU12, PU13, PU21, PU22, PU23, PU31, PU32, and PU33. The program units PU11, PU12, PU13, PU21, PU22, PU23, PU31, PU32, and PU33 may receive one of program voltages VPGM1, VPGM2 and VPGM3 and one of selection signals SWL1, SWL2, and SWL3. Each of the program units PU11, PU12, PU13, PU21, PU22, PU23, PU31, PU32, and PU33 is programmed in response to the program signal PGM and outputs a program output signal PS in response to a sensing enable signal SEN. For example, the program unit PU11 may receive the first program voltage VPGM1 and the first selection signal SWL1, be programmed in response to the program signal PGM, and output the program output signal PS in response to the sensing enable signal SEN.

In some embodiments, the program units PU11, PU12, PU13, PU21, PU22, PU23, PU31, PU32, and PU33 are arranged in a matrix configuration including a plurality of rows and a plurality of columns. The program units PU11, PU12, PU13, PU21, PU22, PU23, PU31, PU32, and PU33 in 3*3 matrix configurations in FIG. 11, a number of program units included in the fuse array unit 510 may vary. The program signal PGM, the sensing enable signal SEN and the program output signal may be provided to or may be output from a selected program unit of the program units PU11, PU12, PU13, PU21, PU22, PU23, PU31, PU32, and PU33 in response to the program voltages VPGM1, VPGM2, and VPGM3 and the selection signals SWL1, SWL2 and SWL3. For example, the program unit PU11 may be enabled when the program voltage VPGM1 and the selection signal SWL1 are activated. The program unit PU11 receives the activated program signal PGM and is programmed in a program mode, and the program unit PU11 receives the activated sensing enable signal SEN, performs a sensing operation and outputs the sensing output signal PS in a sensing mode.

In some embodiments, each of the program units PU11, PU12, PU13, PU21, PU22, PU23, PU31, PU32, and PU33 may have substantially the same architecture as the program unit 100 in FIG. 2. The sensing unit 520 may employ one of the sensing units 410, 420, 430, and 440 of FIGS. 9A to 9D depending on the architecture of the program units PU11, PU12, PU13, PU21, PU22, PU23, PU31, PU32, and PU33.

When the fuse array 500 of FIG. 11 does not include the control unit 530, the program signal PGM and the sensing enable signal SEM may be provided externally or from an external device.

When the fuse array 500 of FIG. 11 includes the control unit 530, the control unit 530 may provide the program signal PGM and the sensing enable signal SEM to the fuse array unit 510. The control unit 530 may receive the sensing output signal SOUT from the sensing unit 520 and may reprogram the selected program unit when the sensing output signal SOUT indicates that the selected program unit is not normally programmed.

Although the fuse array 500 includes the program units PU11, PU12, PU13, PU21, PU22, PU23, PU31, PU32, and PU33, individual programming operation and sensing operations may be performed on each of the program units PU11, PU12, PU13, PU21, PU22, PU23, PU31, PU32, and PU33, based on the program voltages VPGM1, VPGM2, and VPGM3 and the selection signals SWL1, SWL2, and SWL3. That is, the fuse array 500 may include the sensing unit 520 or the sensing unit 520 and the control unit 530 without regard to the number of program units, and thus, integration ratio of the program units PU11, PU12, PU13, PU21, PU22, PU23, PU31, PU32, and PU33 may be enhanced. In addition, each of the program units PU11, PU12, PU13, PU21, PU22, PU23, PU31, PU32, and PU33 may include at least two anti-fuse elements AF1 and AF2 that are broken down at different levels of the program voltage VPGM, and thus the program performance of the fuse array 500 may be enhance because each of the program units PU11, PU12, PU13, PU21, PU22, PU23, PU31, PU32, and PU33 may operate normally when at least one of the anti-fuse elements AF1 and AF2 is normally programmed.

Figure 12:
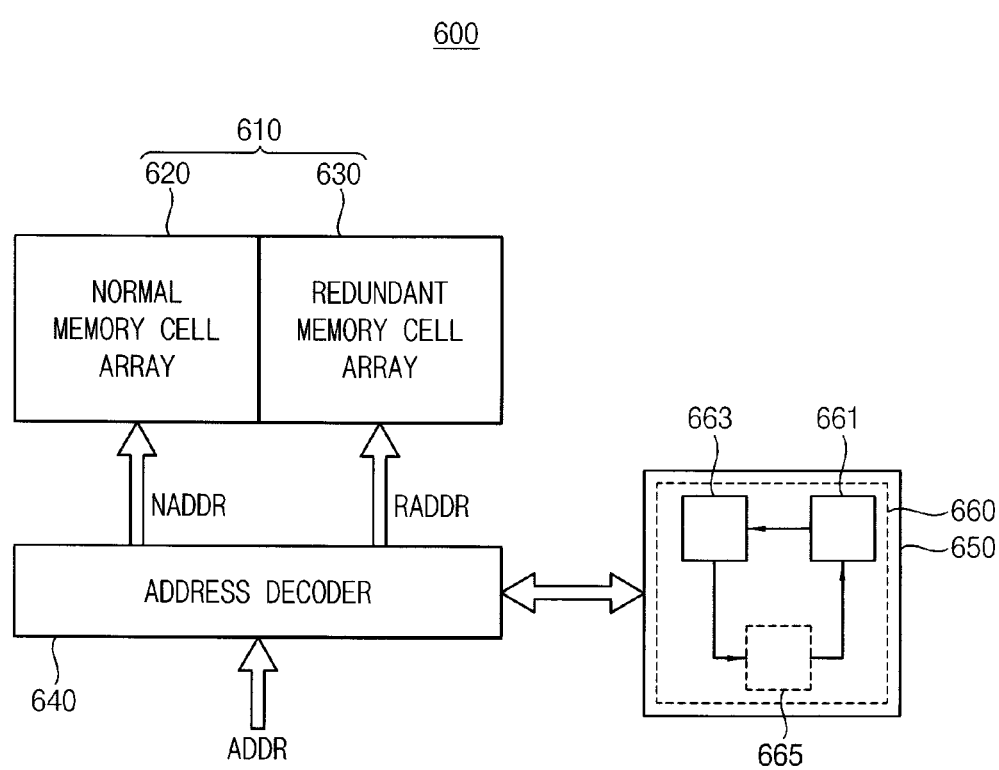
FIG. 12 is a block diagram illustrating a semiconductor memory device including the fuse array of FIG. 11 according to an example embodiment of the general inventive concept.

FIG. 12 is a block diagram illustrating a semiconductor memory device including the fuse array of FIG. 11 according to an example embodiment of the general inventive concept.

Referring to FIG. 12, a semiconductor memory device 600 includes a memory cell array 610, an address decoder 640, and a repair circuit 650.

The memory cell array 610 includes a normal memory cell array 620 and a redundant memory cell array 630. The normal memory cell array 620 includes a plurality of normal memory cells and the redundant memory cell array 630 includes a plurality of redundant memory cells. The redundant memory cell array 630 may be distributed in the memory cell array 610 in a form of a memory block.

The repair circuit 650 is programmed and outputs a sensing output signal indicating whether the repair circuit 650 is programmed or not when the normal memory cells includes at least one defective cell. The address decoder 640 selectively outputs a normal address signal NADDR or a redundant address signal RADDR in response to an address signal ADDR and the sensing output signal to selectively access the normal memory cell and the redundant memory cells. The address decoder 640 may include a column decoder for selecting word-lines or a column decoder for selecting bit-lines. The address decoder 640 may include a column decoder and a row decoder. That is, the repair circuit 650 may have configurations for repairing the defective memory cells by rows or for repairing the defective memory cells by columns.

The repair circuit 650 includes a fuse array 660. The fuse array 660 may employ the fuse array 500 of FIG. 11. The fuse array 660 may include a fuse array unit 661 and a sensing unit 663. The fuse array may further include a control unit 665. The fuse array unit 660 includes a plurality of program units, each of which is programmed in response to the program signal and outputs a program output signal in response to a sensing enable signal. The sensing unit 663 may output a sensing output signal indicating whether the selected program unit is programmed or not based on the program output signal. When the fuse array 650 further includes the control unit 665, the control unit 665 may provide the program signal and the sensing enable signal to the fuse array unit 661. The control unit 665 may reprogram the selected program unit in response to the sensing output signal.

If even a single memory cell within a semiconductor memory device functions improperly, the semiconductor memory device may be considered to be defective. However, if a relatively small number of memory cells are malfunctioning, it may not be efficient to treat the entire semiconductor memory device as being defective. Therefore, one or more redundancy memory cells may be included within the semiconductor memory device so that the redundancy memory cells may functionally replace defective memory cells within the semiconductor memory device. Accordingly, the semiconductor memory device, by replacing the defective memory cell with the redundancy memory cells, may be treated as a non-defective or normal semiconductor memory device, thereby increasing a yield of semiconductor memory devices. A repairing process using the redundancy memory cells may include replacing the defective memory cell with the redundancy memory cell by switching corresponding addresses. For example, if the defective memory cell is detected by a test after wafer processing, a corresponding address of the defective memory cell may be switched to an address of the redundancy memory cell. Therefore, an address of the defective memory cell may be mapped to an address of the redundancy memory cell instead. The fuse circuits may be used to perform the above-mentioned repairing process. If the program performance of the fuse circuit is low, possibility of malfunction of the semiconductor memory device is high. Therefore, performance of the semiconductor memory device may be enhanced by using the fuse circuit having high program performance.

Figure 13:
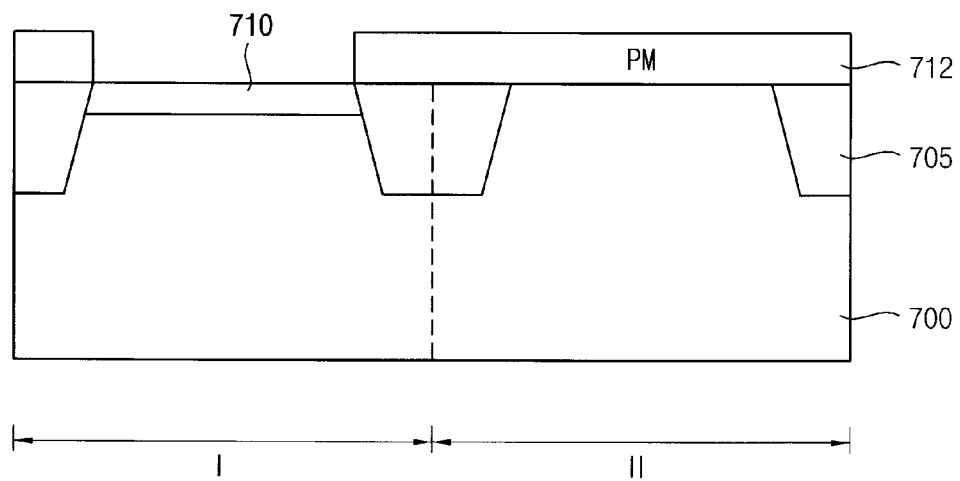
FIGS. 13 to 15 are cross-sectional diagrams for illustrating a method of manufacturing a semiconductor device according to example embodiments of the general inventive concept.
Figure 14:
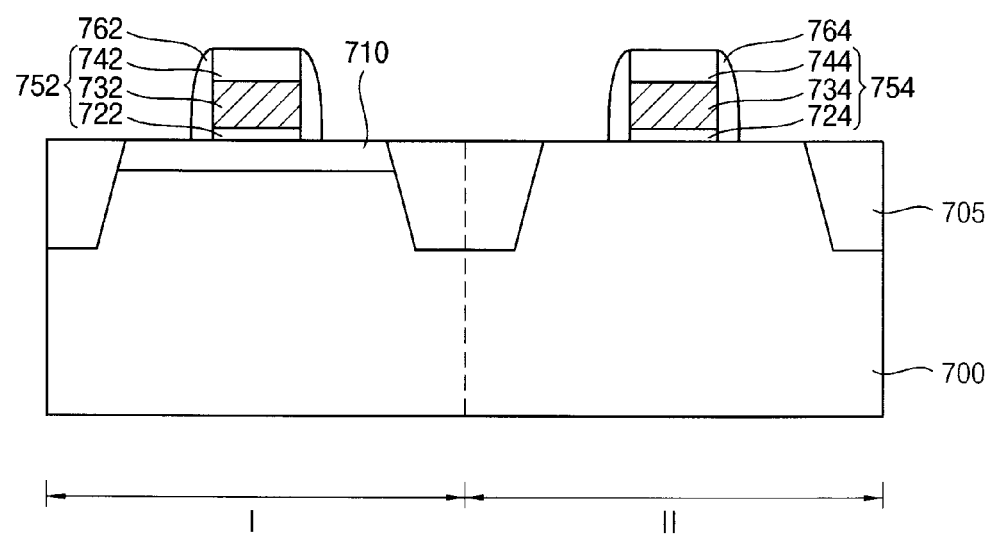
Figure 15:
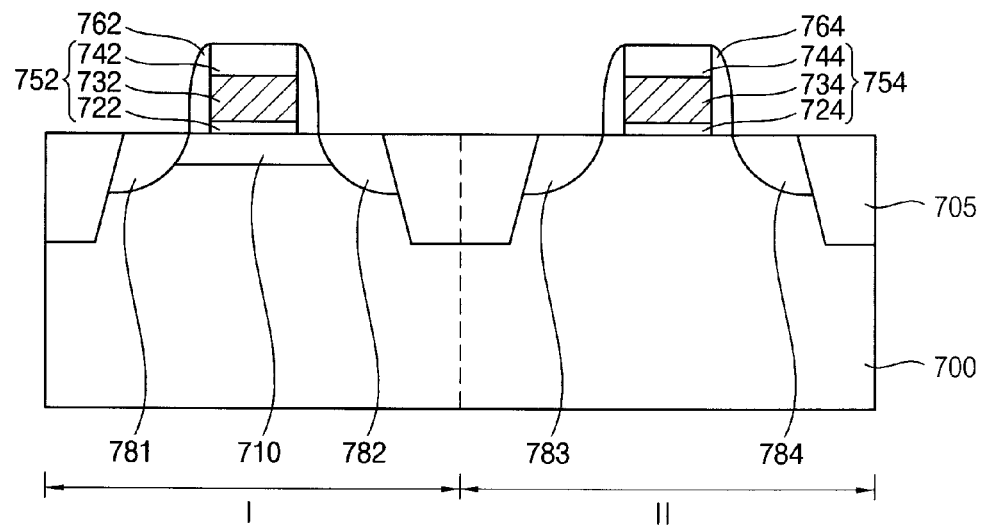

FIGS. 13 to 15 are cross-sectional diagrams for illustrating a method of manufacturing a semiconductor device according to some example embodiments of the general inventive concept.

A first impurity region 710 is selectively formed in a first region I in a substrate 700 in which an isolation layer 705 is formed. The first impurity region 710 is formed by doping regions (including the isolation layer 705 and a second region II) except the first region I with a n-type source gas after masking the regions (including the isolation layer 705 and the second region II) except the first region I with the photo-mask 712. Therefore, the first impurity region 710 may be a n-type impurity region.

The substrate 700 may include a semiconductor substrate such as a silicon substrate, a germanium substrate or a silicon-germanium substrate, a silicon-on-insulator (SOI) substrate, a germanium-on-insulator (GPI) substrate, and the like. The substrate 700 may be divided into the first region I and the second region II. In some embodiments, a depletion type MOS transistor may formed in the first region I, and an enhancement type MOS transistor may be formed in the second region II. The substrate 100 may have a well region (not shown) doped with p-type impurities. The isolation layer 705 may be formed on the substrate 700 through shallow trench isolation (STI) process.

Referring to FIG. 14, first and second gate structures 752 and 754 are respectively formed over the first and second regions I and II of the substrate 700 respectively. In some embodiments, first and second spacers 762 and 764 are respectively formed on respective sidewalls of the first and second gate structures 752 and 754.

The first and second gate structures 752 and 754 are formed by patterning a gate insulating layer, a gate conducting layer and a gate mask layer using a photo-etching process after the gate insulating layer, the gate conducting layer and the gate mask layer are sequentially formed on the substrate 700. Accordingly, the first gate structure 752 may include a first gate insulating layer pattern 722, a first gate electrode 732 and a first gate mask 742 which are sequentially formed on the first region I of the substrate 700, and the second gate structure 754 may include a second gate insulating layer pattern 724, a second gate electrode 734 and a second gate mask 744 which are sequentially formed on the second region II of the substrate 700.

In some embodiments, the first and second insulation layers 722 and 724 may have a thickness equal to or smaller than 25Å.

The gate insulating layer 722 and 724 may include an oxide such as silicon oxide, an oxynitride such as silicon oxynitride. The gate insulating layer 722 and 724 may be formed by performing a thermo-oxidation process on the substrate 100, or by performing a chemical vapor deposition (CVD) process on the substrate 100. The gate conducting layer may include doped polysilicon, a metal, a metal nitride, a metal silicide, and the like. The gate mask layer may include a silicon nitride or a silicon oxynitride. The gate conducting layer and the gate mask layer may be formed by using the CVD process, a physical vapor deposition (PVD) process and an atomic layer deposition (ALD) process.

The first and second spacers 762 and 764 may be formed by partially removing spacer layers by using an anisotropic etching process after forming the gate spacer layers covering the gate masks 742 and 744, the gate electrodes 732 and 734 and the gate insulating patterns 722 and 724. The spacer layers may include a nitride such as silicon nitride.

Referring to FIG. 15, second impurity regions 781 and 782 are formed in the first region I such that the second impurity regions 781 and 782 are partially overlapped with the first impurity region 710.

In some embodiments, the second impurity regions 781 and 782 may be formed by implanting a n-type source gas into the first region I. Therefore, concentration of the second impurity regions 781 and 782 may be higher than a concentration of the first impurity region 710. The second impurity regions 781 and 782 may operate as source/drain region, and thus, the second impurity regions 781 and 782 and the first gate structure 752 may constitute a depletion type MOS transistor.

Third impurity regions 783 and 784 are formed in the second region II of the substrate 700. In some embodiments, the third impurity regions 783 and 784 may be formed by implanting a n-type source gas into the second region II. The third impurity regions 783 and 784 may operate as source/drain region, and thus, the third impurity regions 783 and 784 and the second gate structure 754 may constitute a enhancement type MOS transistor.

In some embodiments, the second impurity regions 781 and 782 and the third impurity regions 783 and 784 may be sequentially formed. The third impurity regions 783 and 784 may be formed by covering the first region I with the photo-mask and doping the n-type source gas using the first gate structure 754 as a photo-mask after the second impurity regions 781 and 782 are formed by covering the second region II with the photo-mask and doping the n-type source gas using the second gate structure 754 as a photo-mask.

In other embodiments, the second impurity regions 781 and 782 and the third impurity regions 783 and 784 may be simultaneously formed. The second impurity regions 781 and 782 and the third impurity regions 783 and 784 may be formed by doping the n-type source gas using the first and second gate structure 752 and 754 as photo-masks.

When the second impurity regions 781 and 782 and the third impurity regions 783 and 784 are formed, the first gate structure 752 and the second impurity regions 781 and 782 constitute a depletion type MOS transistor because the first impurity region 710 operating as a channel that is previously formed in the first region I, and the second gate structure 754 and the third impurity regions 783 and 874 in the second region II constitute an enhancement type MOS transistor.

In another example embodiment, an enhancement type MOS transistor may be formed in the first region I, and a depletion type MOS transistor may be formed in a second region.

In addition, enhancement type MOS transistors may be formed in the first and second region by the method described with reference to FIGS. 13 to 15, except a process that the first impurity region 710 is formed in the first region I.

In addition, depletion type MOS transistors may be formed in the first and second region by the method described with reference to FIGS. 13 to 15, including a process that the first impurity region 710 is formed in the second region II.

Figure 16:
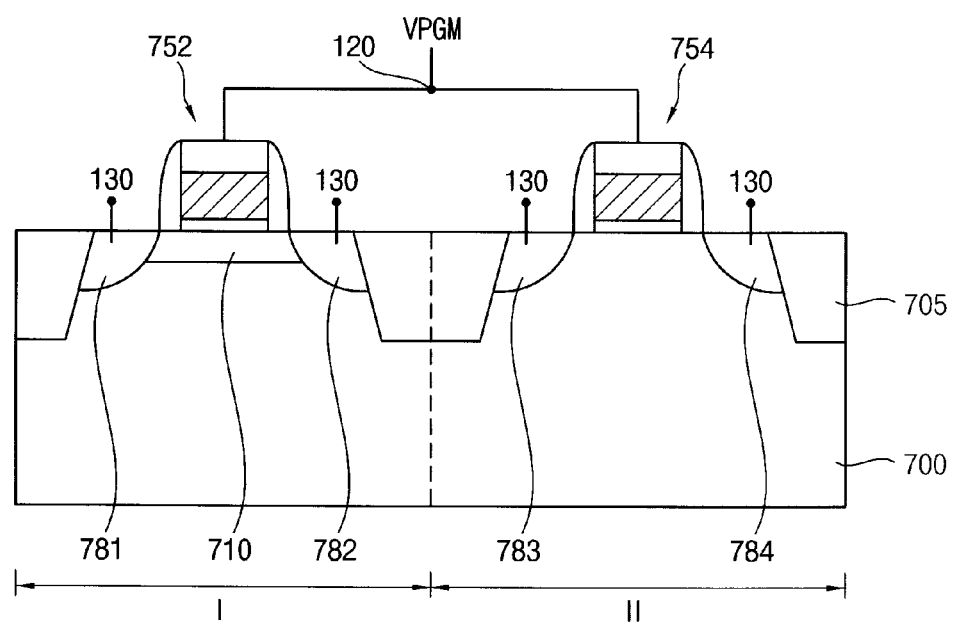
FIGS. 16 and 17 illustrate that the semiconductor device manufactured by a method with reference to FIGS. 13 to 15 is used as anti-fuse elements.
Figure 17:
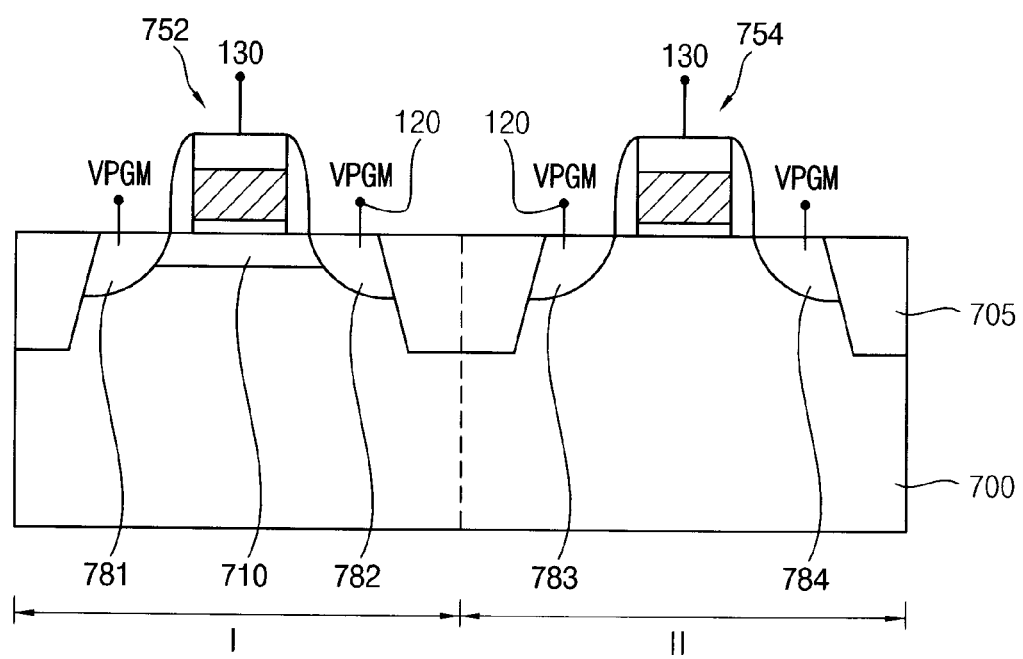

FIGS. 16 and 17 illustrate that the semiconductor device manufactured by a method with reference to FIGS. 13 to 15 is used as anti-fuse elements.

In FIGS. 16 and 17, the substrate 700 that is divided into the first and second regions I and II, the isolation layer 750, the first impurity region 710, the first and second gate structures 752 and 754, the second impurity regions 781 and 782 and the third impurity regions 783 and 784.

FIG. 16 illustrate that the semiconductor device manufactured by a method with reference to FIGS. 13 to 15 is used as the anti-fuse cell of FIG. 3.

Referring to FIG. 16, the program voltage VPGM is applied to the gate structure 752 of the depletion type MOS transistor (corresponding to the first transistor 211 in FIG. 3) formed in the first region I and the gate structure 854 of the enhancement type MOS transistor (corresponding to the second transistor 213 in FIG. 3) formed in the second region II, and the second impurity regions 781 and 782 and the third impurity regions 783 and 784 are connected to the second node 130 of the anti-fuse cell 210 of FIG. 3.

Therefore, the gate oxide layer (corresponding to the first gate insulating layer pattern 722 in FIG. 15) included in the gate structure 752 of the depletion type MOS transistor formed in the first region I and the gate oxide layer (corresponding to the second gate insulating layer pattern 724 in FIG. 15) included in the gate structure 754 of the enhancement type MOS transistor formed in the second region II are broken down at different levels of the program voltage VPGM which is applied to the first node 120. As described with reference to FIG. 8A, the gate oxide layer (corresponding to the first gate insulating layer pattern 722 in FIG. 15) included in the gate structure 752 of the depletion type MOS transistor formed in the first region I is broken down at a lower level of the program voltage VPGM than the gate oxide layer (corresponding to the second gate insulating layer pattern 724 in FIG. 15) included in the gate structure 754 of the enhancement type MOS transistor formed in the second region II because of the first impurity region 710 operating as a channel that is previously formed.

FIG. 17 illustrate that the semiconductor device manufactured by a method with reference to FIGS. 13 to 15 is used as the anti-fuse cell of FIG. 4.

Referring to FIG. 17, the gate structure 752 of the depletion type MOS transistor (corresponding to the first transistor 211 in FIG. 3) formed in the first region I and the gate structure 854 of the enhancement type MOS transistor (corresponding to the second transistor 213 in FIG. 3) formed in the second region II are connected to the second node 130 of the anti-fuse cell 220 of FIG. 4, and the program voltage VPGM is applied to the second impurity regions 781 and 782 and the third impurity regions 783 and 784.

Therefore, the gate oxide layer (corresponding to the first gate insulating layer pattern 722 in FIG. 15) included in the gate structure 752 of the depletion type MOS transistor formed in the first region I and the gate oxide layer (corresponding to the second gate insulating layer pattern 724 in FIG. 15) included in the gate structure 754 of the enhancement type MOS transistor formed in the second region II are broken down at different levels of the program voltage VPGM which is applied to the first node 120. As described with reference to FIG. 8B, the gate oxide layer (corresponding to the first gate insulating layer pattern 722 in FIG. 15) included in the gate structure 752 of the depletion type MOS transistor formed in the first region I is broken down at a lower level of the program voltage VPGM than the gate oxide layer (corresponding to the second gate insulating layer pattern 724 in FIG. 15) included in the gate structure 754 of the enhancement type MOS transistor formed in the second region II because of the first impurity region 710 operating as a channel that is previously formed.

Example embodiments may be widely applicable for repairing semiconductor memory devices because the anti-fuse cell includes multiple anti-fuse elements which are broken down at different levels of the program voltage, which allows the anti-fuse cell to normally operate when at least one of the anti-fuse elements is normally programmed, and the program performance may be enhanced.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:
1. A fuse circuit comprising:
   a program unit configured to be programmed in response to a program signal and configured to output a program output signal in response to a sensing enable signal; and
   a sensing unit configured to output a sensing output signal based on the program output signal, the sensing output signal indicating whether the program unit is programmed or not, the program unit comprising:
an anti-fuse cell including at least two anti-fuse elements which are connected in parallel and are respectively broken down at different levels of a program voltage, the anti-fuse cell including a first node and a second node, the first node receiving the program voltage;
a selection transistor, connected between the second node and a connection node, the selection transistor having a gate which receives a selection signal;
a program transistor, connected between the connection node and a ground voltage, the program transistor having a gate which receives the program signal; and
a sensing transistor which has a first terminal connected to the connection node, a gate receiving the sensing enable signal and a second terminal providing the program output signal.

2. The fuse circuit of claim 1, wherein the anti-fuse cell comprises first and second transistors which are connected in parallel between the first and second nodes.

3. The fuse circuit of claim 2, wherein the first transistor is a depletion type transistor which has a gate connected to the first node and source and drain commonly connected to the second node, and
the second transistor is an enhancement type transistor which has a gate connected to the first node and source and drain commonly connected to the second node.

4. The fuse circuit of claim 2, wherein the first transistor is a depletion type transistor which has a gate connected to the second node and source and drain commonly connected to the first node, and
the second transistor is an enhancement type transistor which has a gate connected to the second node and source and drain commonly connected to the first node.

5. The fuse circuit of claim 2, wherein the first transistor is a first enhancement type transistor which has a gate connected to the first node and source and drain commonly connected to the second node, and
the second transistor is a second enhancement type transistor which has a gate connected to the second node and source and drain commonly connected to the first node.

6. The fuse circuit of claim 2, wherein the first transistor is a first depletion type transistor which has a gate connected to the first node and source and drain commonly connected to the second node, and
the second transistor is a second depletion type transistor which has a gate connected to the second node and source and drain commonly connected to the first node.

7. The fuse circuit of claim 1, wherein the anti-fuse cell comprises first through fourth transistors which are connected in parallel between the first and second nodes.

8. The fuse circuit of claim 7, wherein the first transistor is a first depletion type transistor which has a gate connected to the first node and source and drain commonly connected to the second node,
the second transistor is a first enhancement type transistor which has a gate connected to the first node and source and drain commonly connected to the second node,
the third transistor is a second depletion type transistor which has a gate connected to the second node and source and drain commonly connected to the first node, and
the fourth transistor is a second enhancement type transistor which has a gate connected to the second node and source and drain commonly connected to the first node.

9. The fuse circuit of claim 1, wherein the sensing unit comprises at least one comparator which compares the program output signal with at least one reference voltage to provide the sensing output signal.

10. The fuse circuit of claim 9, wherein whether the anti-fuse cell is normally programmed or not is determined based on a logic level of the sensing output signal.

11. The fuse circuit of claim 9, wherein the sensing unit comprises:
a first comparator which compares the program output signal with a first reference voltage to provide a first sensing output signal corresponding to a first bit of the sensing output signal; and
a second comparator which compares the program output signal with a second reference voltage to provide a second sensing output signal corresponding to a second bit of the sensing output signal.

12. The fuse circuit of claim 11, wherein whether at least one of the at least two anti-fuse elements is normally programmed or not is determined based on each logic level of each bit of the sensing output signal.

13. The fuse circuit of claim 9, wherein the sensing unit comprises:
a first comparator which compares the program output signal with a first reference voltage to provide a first sensing output signal corresponding to a first bit of the sensing output signal;
a second comparator which compares the program output signal with a second reference voltage to provide a second sensing output signal corresponding to a second bit of the sensing output signal; and
a third comparator which compares the program output signal with a third reference voltage to provide a third sensing output signal corresponding to a third bit of the sensing output signal.

14. The fuse circuit of claim 13, wherein whether at least one of the at least two anti-fuse elements is normally programmed or not is determined based on each logic level of each bit of the sensing output signal.

15. A fuse array comprising:
a fuse array unit including a plurality of program units, each of the program units configured to be programmed in response to a program signal and configured to output a program output signal in response to a sensing enable signal; and
a sensing unit configured to output a sensing output signal based on a program output signal provided from a selected one of the program units, the sensing output signal indicating whether the selected program unit is programmed or not, each of the program units comprising:
an anti-fuse cell including at least two anti-fuse elements which are connected in parallel and are respectively broken down at different levels of a program voltage, the anti-fuse cell including a first node and a second node, the first node receiving the program voltage;
a selection transistor, connected between the second node and a connection node, the selection transistor having a gate which receives a selection signal;
a program transistor, connected between the connection node and a ground voltage, the program transistor having a gate which receives the program signal; and
a sensing transistor which has a first terminal connected to the connection node, a gate receiving the sensing enable signal and a second terminal providing the program output signal.

16. The fuse array of claim 15, further comprising a control unit configured to provide the program signal and the sensing enable signal to the fuse array unit, and configured to selectively reprogram the selected program unit based on the sensing output signal.

* * * * *